United States Patent
Leobandung

(10) Patent No.: US 9,997,413 B1
(45) Date of Patent: Jun. 12, 2018

(54) STACKED VERTICAL DEVICES

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/466,168

(22) Filed: Mar. 22, 2017

(51) Int. Cl.
| | |
|---|---|
| *H01L 29/49* | (2006.01) |
| *H01L 21/8234* | (2006.01) |
| *H01L 21/822* | (2006.01) |
| *H01L 27/088* | (2006.01) |
| *H01L 21/8238* | (2006.01) |
| *H01L 27/092* | (2006.01) |

(52) U.S. Cl.
CPC .. *H01L 21/823487* (2013.01); *H01L 21/8221* (2013.01); *H01L 21/82385* (2013.01); *H01L 21/823456* (2013.01); *H01L 21/823475* (2013.01); *H01L 21/823871* (2013.01); *H01L 21/823885* (2013.01); *H01L 27/088* (2013.01); *H01L 27/092* (2013.01)

(58) Field of Classification Search
CPC ......... H01L 21/823487; H01L 21/8221; H01L 21/823871
See application file for complete search history.

(56) References Cited

U.S. PATENT DOCUMENTS

| | | | | |
|---|---|---|---|---|
| 2010/0112753 A1* | 5/2010 | Lee | ...................... | H01L 21/2007 438/107 |
| 2012/0181580 A1* | 7/2012 | Lue | ...................... | H01L 27/0688 257/208 |
| 2013/0003434 A1* | 1/2013 | Lue | ...................... | H01L 27/0688 365/51 |

OTHER PUBLICATIONS

List of IBM Patents or Patent Applications Treated as Related, dated Nov. 22, 2017, 2 pages.

* cited by examiner

*Primary Examiner* — Michael Shingleton
(74) *Attorney, Agent, or Firm* — Scully, Scott, Murphy & Presser, P.C.; Louis J. Percello, Esq.

(57) ABSTRACT

A semiconductor structure containing a plurality of stacked vertical field effect transistor (FETs) is provided. After forming a first vertical FET of a first conductivity type at a lower portion of a semiconductor fin, a second vertical FET of a second conductivity type is formed on top of the first vertical FET. The second conductivity type can be opposite to, or the same as, the first conductivity type. A source/drain region of the first vertical FET is electrically connected to a source/drain region of the second vertical FET by a conductive strip structure.

11 Claims, 24 Drawing Sheets

STACKED VERTICAL DEVICES

BACKGROUND

The present application relates to semiconductor device fabrication, and more particularly, to the fabrication of stacked vertical field effect transistors (FETs).

Complementary metal oxide semiconductor (CMOS) technology is employed in almost every electronic circuit application. CMOS circuits include both n-type FETs and p-type FETs. In a typical CMOS layout, a p-type FET and an n-type FET are serially connected, typically from source to drain or vice versa. As circuits are scaled to smaller dimensions and thus a smaller area, vertically stacking p-type FETs and n-type FETs is quite attractive to provide greater device packing density. However, in a conventional horizontal FET device configuration in which the source-drain current is following in a direction parallel to a substrate surface, vertically stacking multiple FETs is difficult and may involve bonding. In a vertical FET device configuration in which the source-drain current is following in a direction perpendicular to a substrate surface, stacking multiple FETs can be easier. Therefore, a processing scheme for effectively stacking vertical FETs remains needed.

SUMMARY

The present application provides a processing scheme for fabricating multiple stacked vertical FETs.

According to an aspect of the present application, a semiconductor structure is provided. The semiconductor structure includes a first vertical field effect transistor (FET) of a first conductivity type, and a second vertical FET of a second conductivity type stacked on the first vertical FET. The first vertical FET comprises a first doped epitaxial semiconductor region along sidewalls of a first doped fin region of a semiconductor fin that extends upwards from a semiconductor substrate portion, a first gate structure along sidewalls of a first channel region of the semiconductor fin that is located above the first doped fin region, and a second doped epitaxial semiconductor region along sidewalls of a second doped fin region of the semiconductor fin that is located above the first channel region. The second vertical FET includes a third doped epitaxial semiconductor region along sidewalls of a third doped fin region of the semiconductor fin that is located atop the second doped fin region, a second gate structure along sidewalls of a second channel region of the semiconductor fin that is located above the third doped fin region, and a fourth doped epitaxial semiconductor region along sidewalls a fourth doped fin region of the semiconductor that is located above the second channel region. The semiconductor structure further includes a conductive strap structure laterally contacting the second doped epitaxial semiconductor region and the third doped epitaxial semiconductor region.

According to another aspect of the present application, a method of forming a semiconductor structure is provided. The method includes forming a first vertical field effect transistor (FET) of a first conductivity type. The first vertical FET includes a first doped epitaxial semiconductor region along sidewalls of a first doped fin region of a semiconductor fin that extends upwards from a semiconductor substrate portion, a first gate structure along sidewalls of a first channel region of the semiconductor fin that is located above the first doped fin region, and a second doped epitaxial semiconductor region along sidewalls of a second doped fin region of the semiconductor fin that is located above the first channel region. Next, a second vertical FET of a second conductivity type is stacked on the first vertical FET. The second vertical FET includes a third doped epitaxial semiconductor region along sidewalls of a third doped fin region of the semiconductor fin that is located atop the second doped fin region, a second gate structure along sidewalls of a second channel region of the semiconductor fin that is located above the third doped fin region, and a fourth doped epitaxial semiconductor region along sidewalls a fourth doped fin region of the semiconductor that is located above the second channel region. The method also includes forming a conductive strap structure laterally contacting the second doped epitaxial semiconductor region and the third doped epitaxial semiconductor region.

DETAILED DESCRIPTION

Figure 1:
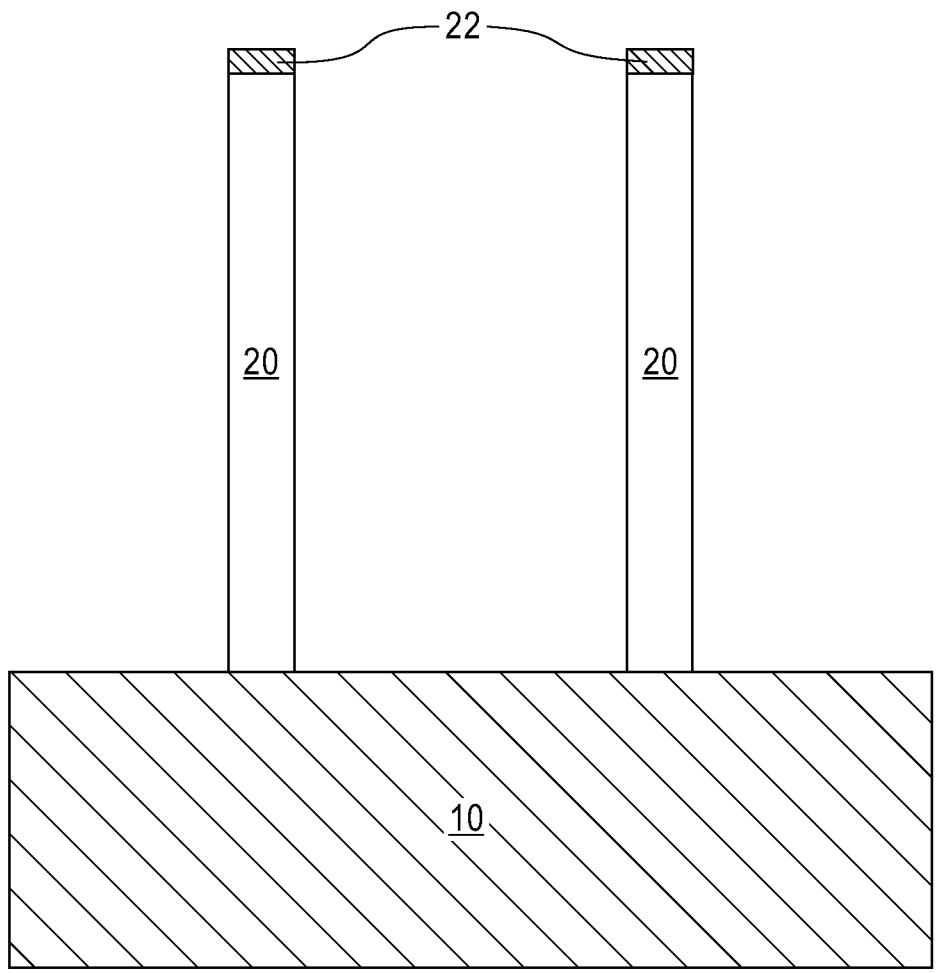
FIG. 1 is a cross-sectional view of an exemplary semiconductor structure including a plurality of semiconductor fins extending upwards from a semiconductor substrate portion according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring now to FIG. 1, there is illustrated an exemplary semiconductor structure that can be employed according to an embodiment of the present application. The semiconductor structure includes a plurality of semiconductor fins 20 extending upwards from a remaining portion of a semiconductor substrate (herein referred to as semiconductor substrate portion 10) and plurality of fin caps formed on top of the semiconductor fins 20.

The exemplary semiconductor structure shown in FIG. 1 can be formed by first providing the semiconductor substrate (not shown). The semiconductor substrate that can be used in the present application is a bulk semiconductor substrate. By "bulk" semiconductor substrate, it is meant a substrate that is entirely composed of at least one semiconductor material having semiconducting properties. In the present application, at least an upper portion of the bulk semiconductor substrate is composed of a semiconductor material including, for example, Si, Ge, SiGe, SiC, SiGeC, III-V compound semiconductors or II-VI compound semiconductors. In one embodiment, the semiconductor substrate is composed entirely of silicon.

The at least one semiconductor material that provides the semiconductor substrate may be single crystalline, polycrystalline or amorphous. In one example, the entirety of, or at least the upper portion of, the semiconductor substrate is composed of a single crystalline semiconductor material such as, for example, single crystalline silicon.

After providing the semiconductor substrate, a dielectric cap layer (not shown) is formed on a topmost surface of the semiconductor substrate. The dielectric cap layer may include a dielectric material such as, for example, silicon dioxide, silicon nitride, silicon oxynitride, a dielectric metal oxide, or a combination thereof. In one embodiment, the dielectric cap layer is composed of silicon dioxide. The dielectric cap layer may be formed by a deposition process including chemical vapor deposition (CVD), plasma enhanced chemical vapor deposition (PECVD), or physical vapor deposition (PVD), or by a thermal growing process such as thermal oxidation or thermal nitridation. The thickness of the dielectric cap layer can be from 1 nm to 10 nm, although lesser and greater thicknesses can also be employed.

The dielectric cap layer and the semiconductor substrate are then patterned to provide the fin caps 22 and the semiconductor fins 20 shown in FIG. 1. In the present application, each semiconductor fin 20 is formed within the upper portion of the semiconductor substrate, while the semiconductor substrate portion 10 represents a remaining lower portion of the semiconductor substrate. A material interface may or may not exist between each semiconductor fin 20 and the semiconductor substrate portion 10. In one embodiment of the present application, each semiconductor fin 20 has a width from 5 nm to 30 nm, although lesser and greater widths can also be employed. The height of each semiconductor fin 20 can be from 20 nm to 200 nm, although lesser and greater heights can also be employed. Each semiconductor fin 20 is spaced apart from its nearest neighboring semiconductor fin 20 by a distance. In one embodiment, the distance between neighboring semiconductor fins 20 can be from 20 nm to 1000 nm. Also, the semiconductor fins 20 are oriented parallel to each other. Each semiconductor fin 20 can have a circular shape or a rectangular shape.

In one embodiment of the present application, the patterning used to provide the fin cpas 22 and the semiconductor fins 20 may include lithography and etching. Lithography includes forming a photoresist layer (not shown) atop the dielectric cap layer. The photoresist layer may include a positive-tone photoresist material, a negative-tone photoresist material or a hybrid-tone photoresist material. The photoresist layer may be formed by a deposition process such as, for example, spin coating. After forming the photoresist layer, the photoresist layer is subjected to a pattern of irradiation. Next, the exposed photoresist layer is developed utilizing a conventional resist developer. This provides a patterned photoresist layer atop the dielectric cap layer to be patterned. The pattern provided by the patterned photoresist layer is thereafter transferred into the underlying dielectric cap layer and semiconductor substrate utilizing at least one pattern transfer etching process. Typically, the at least one pattern transfer etching process is an anisotropic etch. In one embodiment, a dry etch such as, for example, reactive ion etch (RIE) can be used. In another embodiment, a wet etch utilizing chemical etchant can be used. In still a further embodiment, a combination of dry etch and wet etch can be used. In the illustrated embodiment, the etch stops within a portion of the semiconductor substrate.

In another embodiment of the present application, the patterning used to provide the fin caps 22 and the semiconductor fins 20 may include a sidewall image transfer (SIT) process. The SIT process includes forming a mandrel material layer (not shown) atop the dielectric cap layer to be patterned. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal such as, for example, Al, W, or Cu. The mandrel material layer can be formed, for example, by CVD or PECVD. Following deposition of the mandrel material layer, the mandrel material layer can be patterned by lithography and etching to form a plurality of mandrel structures (also not shown) on the topmost surface of the semiconductor substrate.

The SIT process continues by forming a spacer on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in depositing the spacer material include, for example, CVD, PECVD or atomic layer deposition (ALD). Examples of etching that be used in providing the spacers include any etching process such as, for example, RIE.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying dielectric cap layer and semiconductor substrate. The pattern transfer may be achieved by utilizing at least one etching process. Examples of etching processes that can used to transfer the pattern may include dry etch (i.e., RIE, plasma etching, ion beam etching or laser ablation) and/or wet etch. In one example, the etching process used to transfer the pattern may include one or more RIE steps. Upon completion of the pattern transfer, the SIT process concludes by removing the spacers from the structure. Each spacer may be removed by etching or a planarization process.

Figure 2:
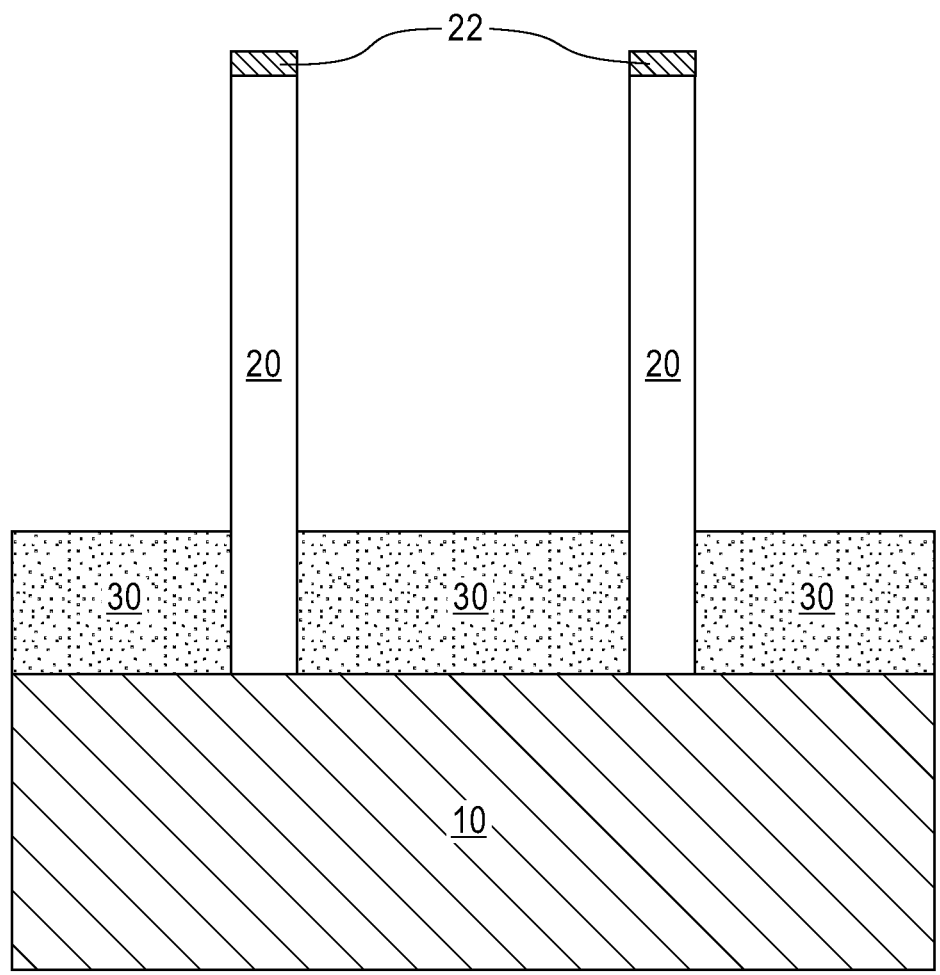
FIG. 2 is a cross-sectional view of the exemplary semiconductor structure of FIG. 1 after forming a shallow trench insulator (STI) layer around a bottom portion of each semiconductor fin.

Referring now to FIG. 2, there is illustrated the exemplary semiconductor structure of FIG. 1 after forming a shallow trench insulator (STI) layer 30 around a lower portion of each semiconductor fin 20. A topmost surface of the STI layer 30 thus is vertically offset from and located beneath a topmost surface of each semiconductor fin 20. The STI layer 30 may have a thickness ranging from 50 nm to 80 nm, although lesser and greater thicknesses can also be employed.

The STI layer 30 may be composed of any dielectric material capable of being removed selectively to sacrificial spacers to be subsequently formed. In one embodiment, the STI layer 30 includes a dielectric oxide such as, for example, silicon dioxide. The STI layer 30 may be formed by depositing a dielectric material over the semiconductor substrate portion 10 and the semiconductor fins 20 using a conventional deposition technique, such as, for example, CVD or PVD, planarizing the deposited dielectric material by a conventional planarization technique such as, for example, chemical mechanical planarization (CMP), and then etching back the deposited dielectric material to the desired thickness. In some embodiments, the planarization step may be omitted. An anisotropic etch such as, for example, RIE may be employed to remove the dielectric material of the STI layer 30 selective to the semiconductor material of the semiconductor fins 20.

Figure 3:
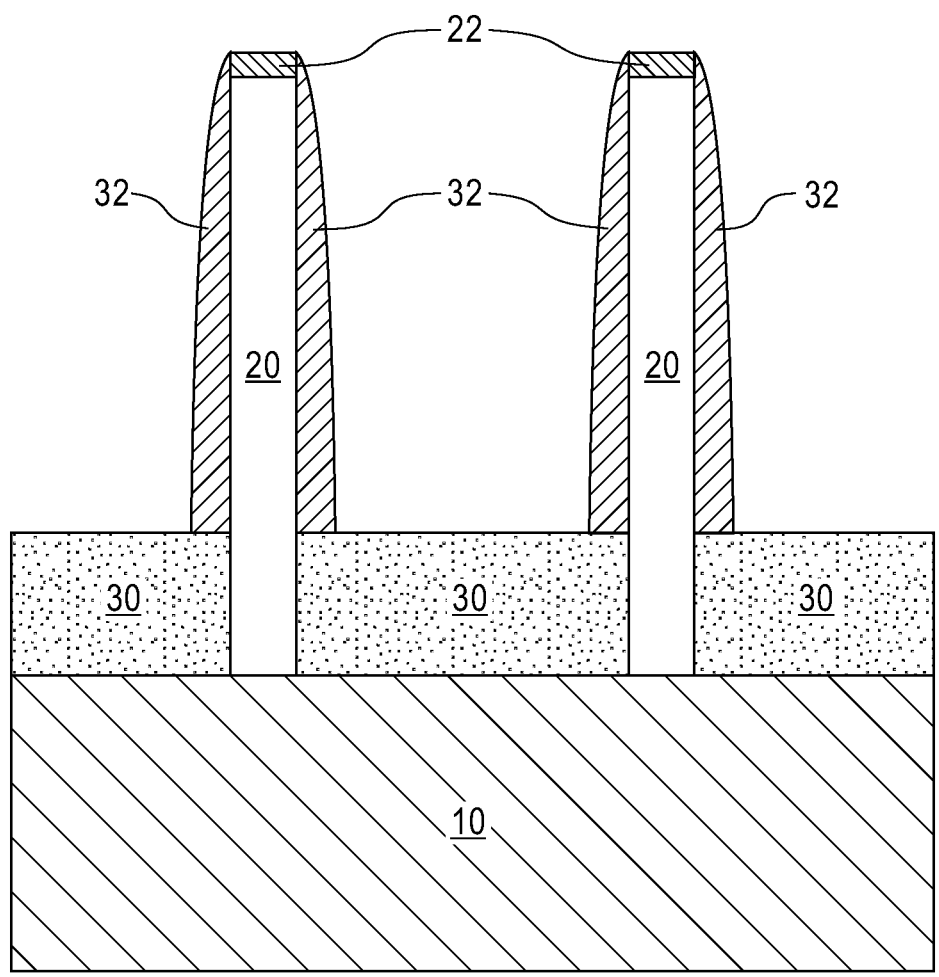
FIG. 3 is a cross-sectional view of the exemplary semiconductor structure of FIG. 2 after forming a first sacrificial spacer on sidewalls of a portion of each semiconductor fin that are not covered by the STI layer.

Referring now to FIG. 3, there is illustrated the exemplary semiconductor structure of FIG. 2 after forming a first sacrificial spacer 32 on sidewalls of a portion of each semiconductor fin 20 that are not covered by the STI layer 30 and on sidewalls of each fin cap 22. Each first sacrificial spacer 32 may include a dielectric material that differs from the dielectric material that provides STI layer 30. Exemplary dielectric materials that can be used in providing each first sacrificial spacer 32 include, but are not limited to, an oxide, a nitride and an oxynitride. In one embodiment, each first sacrificial spacer 32 is composed of silicon nitride.

The first sacrificial spacers 32 can be formed by first conformally depositing a first sacrificial spacer material layer (not shown) on physically exposed surfaces of each semiconductor fin 20 (i.e., sidewall surfaces of the semiconductor fins 20 not covered by the STI layer 30), each fin cap 22 and the STI layer 30 utilizing, for example, CVD or ALD. Subsequently, horizontal portions of the conformal first sacrificial spacer material layer are removed by an anisotropic etch such as, for example, RIE. Vertical portions of the conformal first sacrificial spacer material layer that remain on the sidewalls of the physically exposed portion of each semiconductor fin 20 and sidewalls of each fin cap 22 constitute the first sacrificial spacer(s) 32. Each first sacrificial spacer 32 can have a width, as measured at the base, from 10 nm to 20 nm, although lesser and greater widths can also be employed. As is shown, each first sacrificial spacer 32 has a topmost surface that is coplanar with the topmost surface of each semiconductor fin 20.

Figure 4:
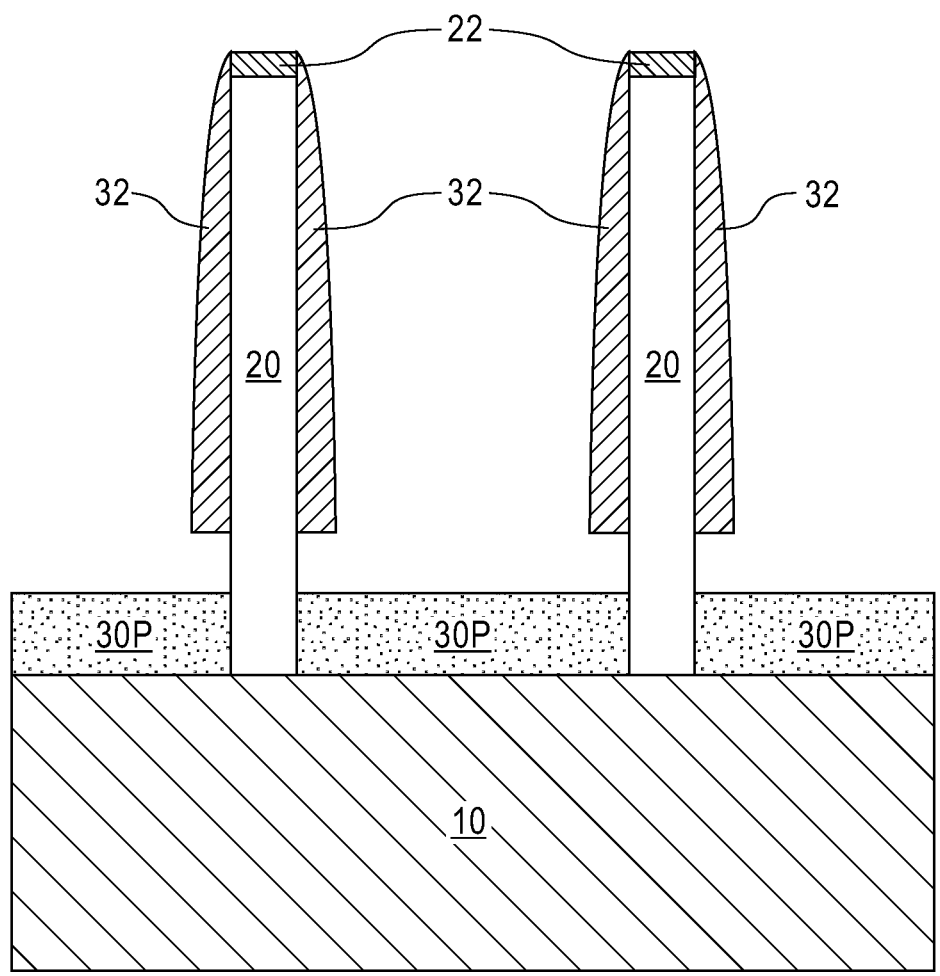
FIG. 4 is a cross-sectional view of the exemplary semiconductor structure of FIG. 3 after recessing the STI layer to provide a STI structure.

Referring now to FIG. 4, there is illustrated the exemplary semiconductor structure of FIG. 3 after recessing the STI layer 30 to form a STI structure 30P laterally surrounding a base portion of each semiconductor fin 20. The STI structure 30P has a topmost surface located below the bottommost surface of each first sacrificial spacer 32. As such, sidewalls of a bottom portion of each semiconductor fin 20 that is located between the STI structure 30P and a corresponding first sacrificial spacer 32 are exposed.

The STI layer 30 may be recessed using an isotropic etch. The isotropic etch can be a dry etch or a wet etch that removes the dielectric material that provides the STI layer 30 selective to the semiconductor material that provides the semiconductor fins 20 and the dielectric materials that provides the first sacrificial spacers 32 and the fin caps 22. In one embodiment, a RIE may be performed. After recessing, the STI structure 30P may have a thickness from 10 nm to 30 nm, although lesser and greater thicknesses can also be employed.

Figure 5:
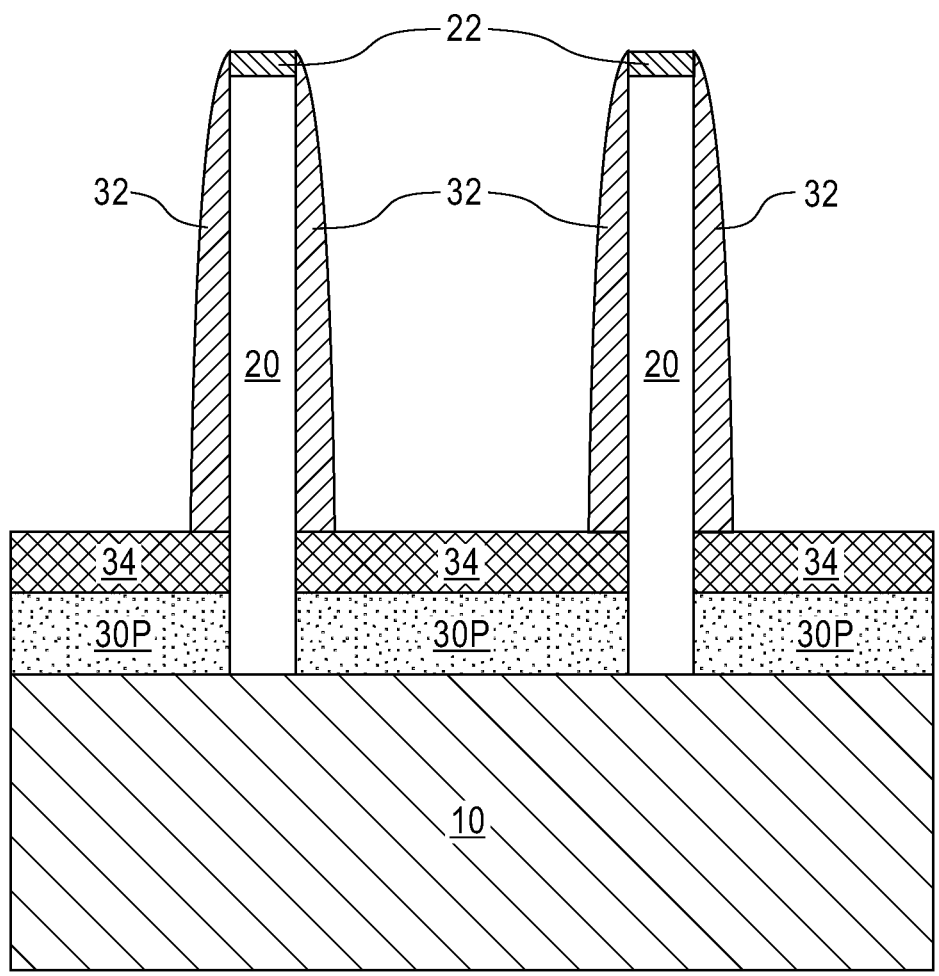
FIG. 5 is a cross-sectional view of the exemplary semiconductor structure of FIG. 4 after forming a first doped epitaxial semiconductor layer between the STI structure and each first sacrificial spacer.

Referring now to FIG. 5, there is illustrated the exemplary semiconductor structure of FIG. 4 after growing a first doped epitaxial semiconductor layer 34 from the sidewalls of the physically exposed portion of each semiconductor fin 20 located between the STI structure 30P and each first sacrificial spacer 32. In one embodiment, and as is shown, the first doped epitaxial semiconductor layer 34 is formed on an entirety of a physically exposed topmost surface of the STI structure 30P. In another embodiment, the first doped epitaxial semiconductor layer 34 does not cover the entire exposed surface of the STI structure 30P; rather it only covers portions of the STI structure 30P proximal to each semiconductor fin 20.

The first doped epitaxial semiconductor layer 34 may include any semiconductor material as mentioned above for the semiconductor fins 20 (i.e., semiconductor material that provides the upper portion of the semiconductor substrate). In one embodiment of the present application, the first doped epitaxial semiconductor layer 34 includes a same semiconductor material as the semiconductor material that provides the semiconductor fins 20. For example, both the first doped epitaxial semiconductor layer 34 and the semiconductor fins 20 may be composed of silicon. In another embodiment of the present application, the first doped epitaxial semiconductor layer 34 includes a different semiconductor material than the semiconductor material that provides the semiconductor fins 20. For example, the first doped epitaxial semiconductor layer may be composed of SiGe and the semiconductor fins 20 may be composed of silicon.

The first doped epitaxial semiconductor layer 34 includes a dopant of a first conductivity type, which can be p-type or n-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. In one embodiment, the first doped epitaxial semiconductor layer 34 is doped with a p-type dopant. The dopant concentration of the first doped epitaxial semiconductor layer 34 can be from $1 \times 10^{20}$ atoms/cm$^3$ to $1 \times 10^{22}$ atoms/cm$^3$, although lesser and greater dopant concentration can also be employed.

The first doped epitaxial semiconductor layer 34 may be formed by a selective epitaxial growth process. The selective epitaxial growth process grows the semiconductor material that provides first doped epitaxial semiconductor layer 34 only from the semiconductor surfaces such as exposed sidewall surfaces of the semiconductor fins 20, but not from dielectric surfaces, such as surfaces of the STI structure 30P, the first sacrificial spacers 32 and the fin caps 22. Examples of various epitaxial growth processes that are suitable for use in formation of the first doped epitaxial semiconductor layer 34 include, but are not limited to, molecular beam epitaxy (MBE) and metal-organic chemical vapor deposition (MOCVD). The dopant can be provided during selective epitaxial growth process by in-situ doping, or after selective epitaxial growth process by ion implantation or gas phase doping. In one embodiment, and as is shown, the selective epitaxial growth process can be continued until the first doped epitaxial semiconductor layer 34 merges neighboring semiconductor fins 20. After epitaxial growth, the topmost surface of the first doped epitaxial semiconductor layer 34 is located above or coplanar with the bottommost surface of each first sacrificial spacer 32.

Figure 6:
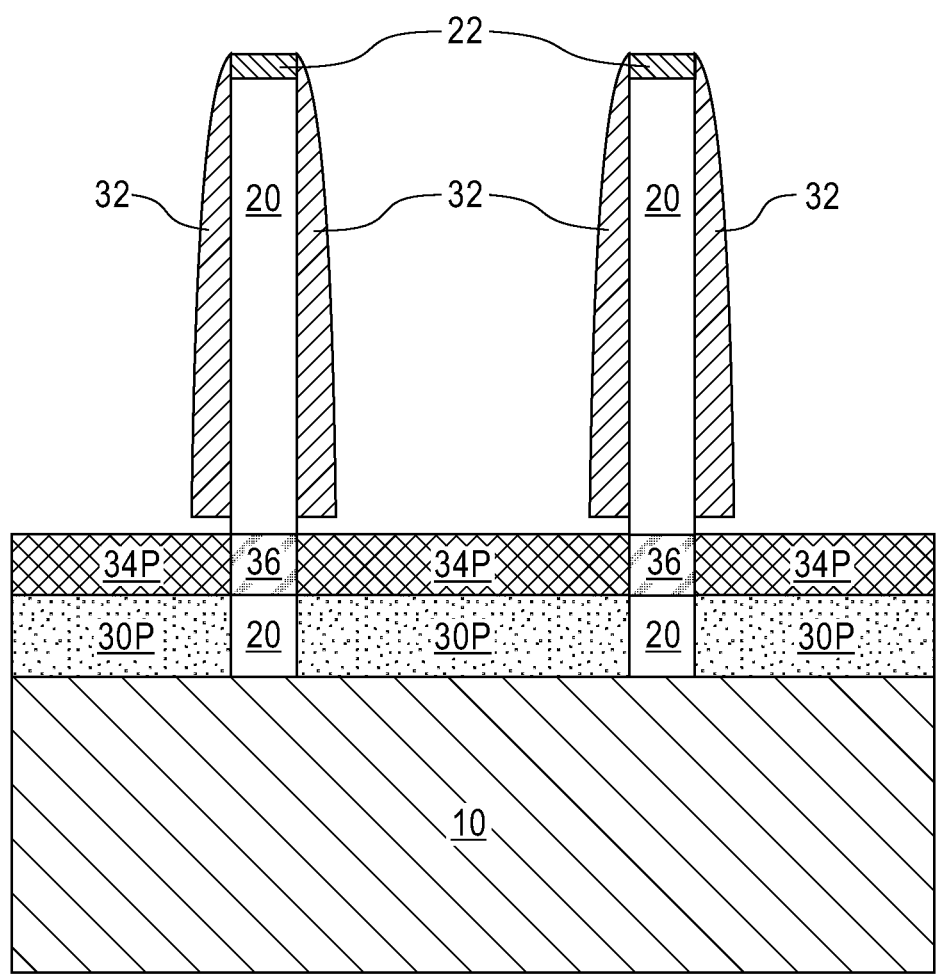
FIG. 6 is a cross-sectional view of the exemplary semiconductor structure of FIG. 5 after recessing the first doped epitaxial semiconductor layer to provide a first doped epitaxial semiconductor region and forming a first doped fin region within each semiconductor fin.

Referring now to FIG. 6, there is illustrated the exemplary semiconductor structure of FIG. 5 after recessing the first doped epitaxial semiconductor layer 34 to provide a first doped epitaxial semiconductor region 34P. The first doped epitaxial semiconductor layer 34 can be recessed by an isotropic etch. The isotropic etch can be a dry etch such as RIE or a wet etch that removes the semiconductor material that provides the first doped epitaxial semiconductor layer 34 selective to the dielectric materials that provides the first sacrificial spacers 32 and the fin caps 22. After recessing, a remaining portion of the first doped epitaxial semiconductor layer 34 constitutes the first doped epitaxial semiconductor region 34P. The first doped epitaxial semiconductor region 34P has a topmost surface located below the bottommost surface of each first sacrificial spacer 32.

Subsequently, an anneal is performed to drive the dopant in the first doped epitaxial semiconductor region 34P into each semiconductor fin 20, forming a first doped fin region 36 in a portion of each semiconductor fin 20 laterally contacted by the first doped epitaxial semiconductor region 34P. Collectively, each first doped fin region 36 and the first doped epitaxial semiconductor region 34P constitute a source or a drain region (herein referred to as a source/drain region) for each first vertical FET subsequently formed. Each first vertical FET can be a p-type or n-type FET depending on the conductivity type of the first doped epitaxial semiconductor region 34P. In one embodiment and when the first doped epitaxial semiconductor region 34P is doped to a p-type conductivity, each first vertical FET is a p-type FET.

Figure 7:
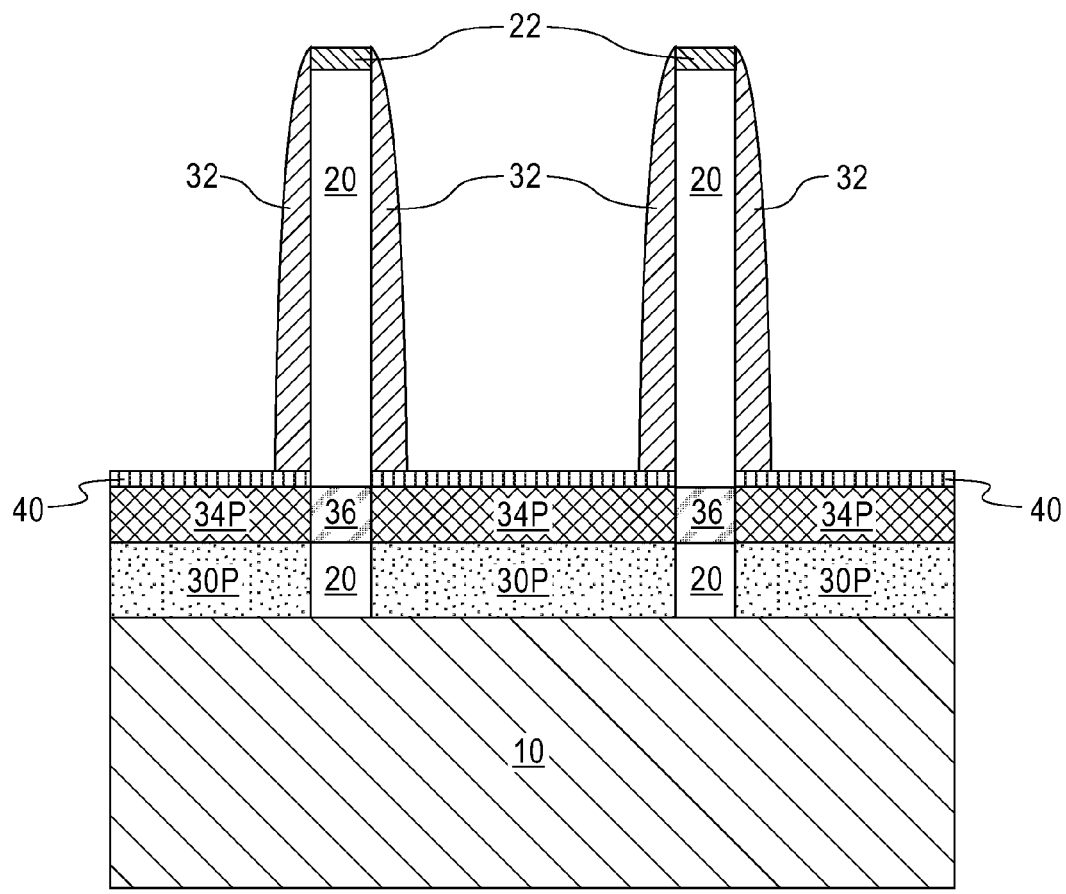
FIG. 7 is a cross-sectional view of the exemplary semiconductor structure of FIG. 6 after forming a first insulating spacer on a physically exposed surface of the first doped epitaxial semiconductor region.

Referring now to FIG. 7, there is illustrated the exemplary semiconductor structure of FIG. 6 after forming a first insulating spacer 40 on a physically exposed surface of the first doped epitaxial semiconductor region 34P. The first insulating spacer 40 is located between each first sacrificial spacer 32 and the first doped epitaxial semiconductor region 34P and contacts the bottommost surface of each first sacrificial spacer 32.

The first insulating spacer 40 may include a dielectric material that has a different etch selectivity with respect to the dielectric material that provides the first sacrificial spacers 32. In one embodiment and when the first sacrificial spacers 32 are composed of a dielectric nitride, the first insulating spacer 40 includes a dielectric oxide such as, for example, silicon dioxide. In one embodiment, the first insulating spacer 40 can be formed by oxidation of an upper portion of the first doped epitaxial semiconductor region 34P. In another embodiment, the first insulating spacer 40 can be formed by a deposition process such as, for example, CVD or PVD followed by planarization and recess of deposited dielectric material. The thickness of the first insulating spacer 40 can be from 5 nm to 10 nm, although lesser and greater thickness can also be employed.

Figure 8:
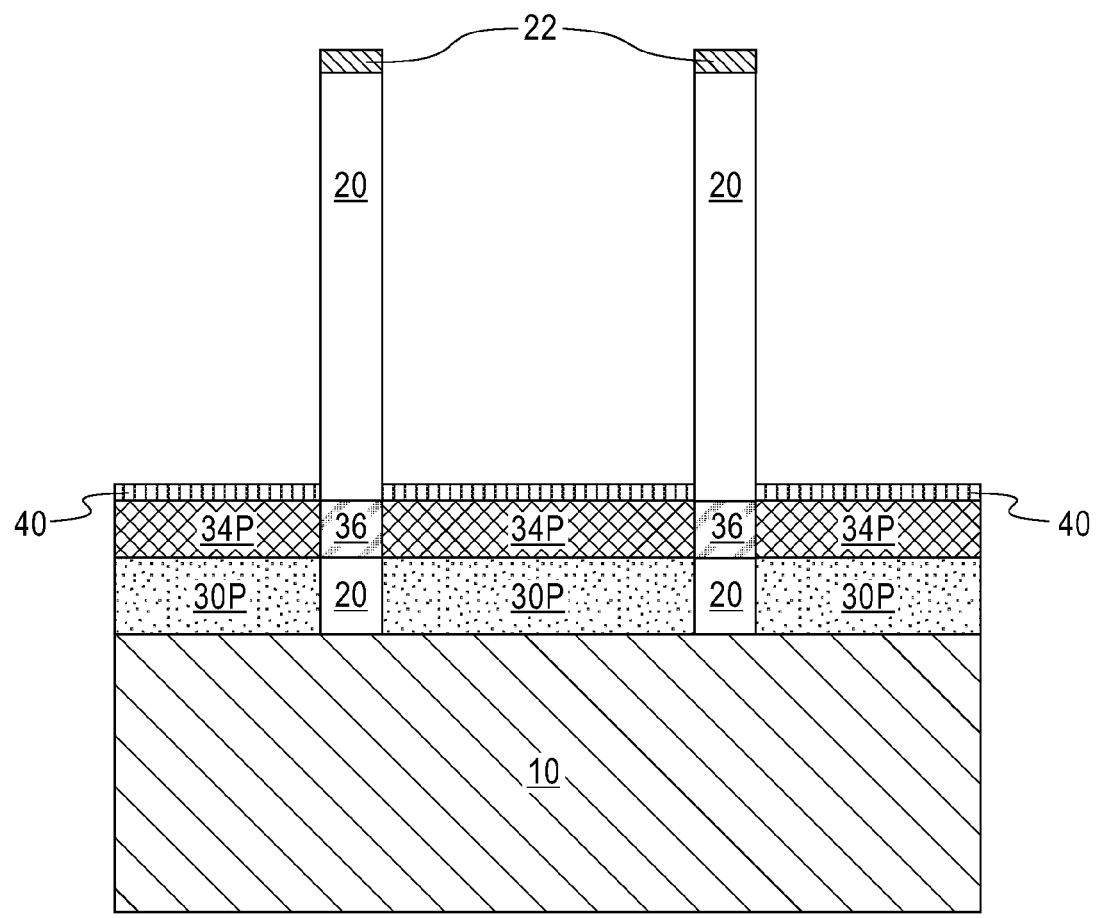
FIG. 8 is a cross-sectional view of the exemplary semiconductor structure of FIG. 7 after removing each first sacrificial spacer.

Referring now to FIG. 8, there is illustrated the exemplary semiconductor structure of FIG. 7 after removing the first sacrificial spacers 32. The first sacrificial spacers 32 can be removed by an etch which can be an isotropic etch or an anisotropic etch. In one embodiment, the first sacrificial spacers 32 can be removed by a wet etch. For example, if the first sacrificial spacers 32 are composed of silicon nitride, and each of the first insulating spacer 40 and the fin caps 22 is composed of silicon dioxide, the first sacrificial spacers 32 can be removed by a wet etch employing hot phosphoric acid. After removal of the first sacrificial spacers 32, sidewalls of an entire portion of each semiconductor fin 20 located above the first insulating spacer 40 are exposed.

Figure 9:
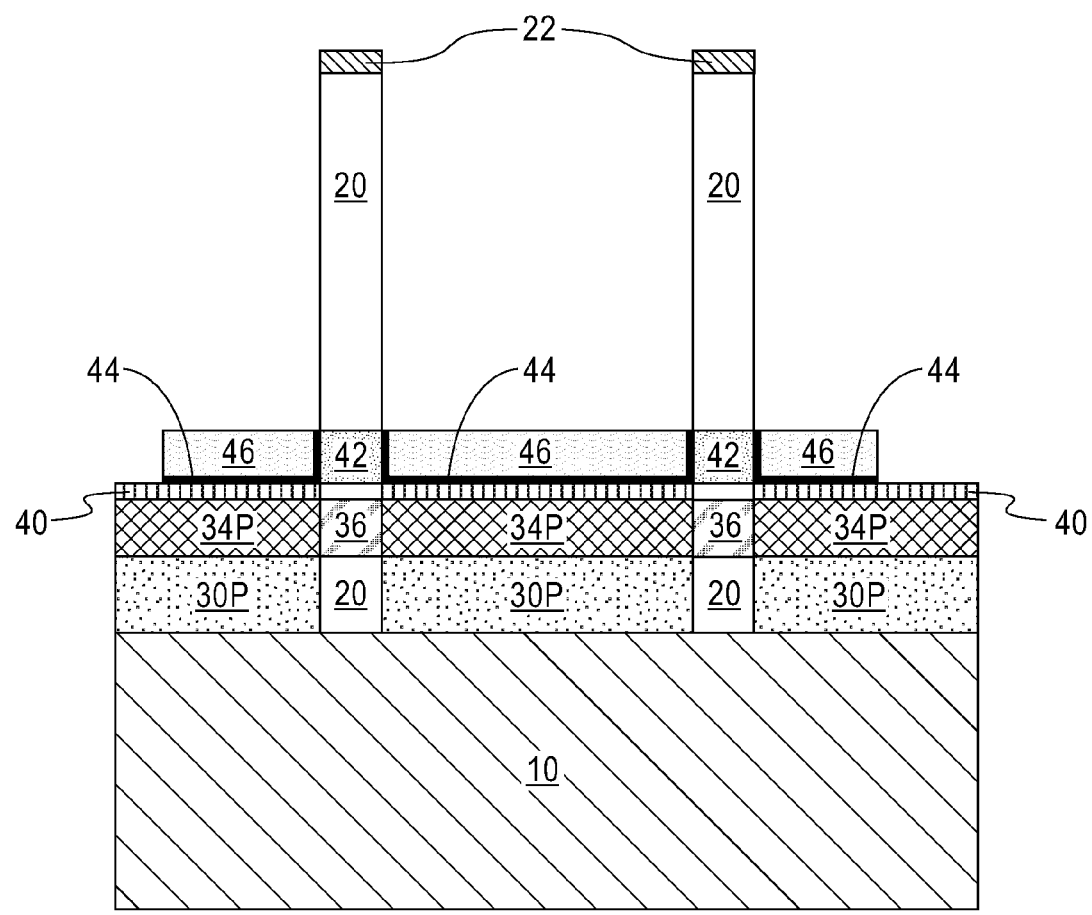
FIG. 9 is a cross-sectional view of the exemplary semiconductor structure of FIG. 8 after forming a first gate structure laterally surrounding a first channel region of each semiconductor fin.

Referring now to FIG. 9, there is illustrated the exemplary semiconductor structure of FIG. 8 after forming a first gate structure laterally contacting sidewalls of a first channel region 42 of each semiconductor fin 20. The first gate structure includes a first gate dielectric 44 present on sidewalls of the first channel region 42 of each semiconductor fin 20 and a topmost surface of the first gate spacer 40 and a first gate electrode 46 present on the first gate dielectric 44.

The gate dielectric 44 may include a high-k dielectric material having a dielectric constant greater than silicon dioxide. Exemplary high-k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In one embodiment, the gate dielectric 44 includes $HfO_2$. In some embodiments, the gate dielectric 44 may have a multilayer structure comprising different gate dielectric materials, e.g. silicon dioxide, and a high-k gate dielectric material can be formed. The thickness of the gate dielectric 44 can be from 1 nm to 5 nm, although lesser and greater thicknesses can also be employed.

The first gate electrode 46 may include a conformal work function metal and/or a gate fill metal. The work function metal is employed for adjusting work function level of the first gate structure (44, 46). In one embodiment and when each first vertical FET is a p-type FET, a p-type work function metal may be used. Exemplary p-type work function metals include, but are not limited to, Pt, Rh, Jr, Ru, Cu, Os, Be, Co, Pd, Te, Cr, Ni, and TiN. In another embodiment and when each first vertical FET is an n-type FET, an n-type work function metal may be used. Exemplary n-type work function metals include, but are not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAlN. The gate fill metal may include a conductive metal such as, for example, W or Cu. The thickness of the gate electrode 46 can be from 10 nm to 20 nm, although lesser and greater thicknesses can also be employed.

The first gate structure (44, 46) can be formed by sequentially depositing a conformal gate dielectric layer (not shown) on physically exposed surfaces of the first insulating spacer 40, each semiconductor fin 20 and each fin cap 22, and a gate electrode layer (not shown) on the gate dielectric layer. Each of the gate dielectric layer and the gate electrode layer can be formed, for example, by CVD, PECVD, PVD, or atomic layer deposition (ALD). After deposition, the gate electrode layer is recessed by an etch. The etch can be a dry etch such as RIE or a wet etch that removes the conductive metal(s) that provides the gate electrode layer selective to the dielectric material(s) that provides the gate dielectric layer. In some embodiments of the present application and when the gate electrode 46 includes both work function metal and gate fill metal, two separate etch processes can be performed to recess the gate fill metal and work function metal. Next, end portions of a remaining portion of the gate electrode layer are removed by lithography and etching to provide the gate electrode 46. After formation of the gate electrode 46, portions of the gate dielectric layer that are not covered by the gate electrode 46 are removed by an anisotropic etch to provide the gate dielectric 44. The anisotropic etch can be a dry etch such as, for example, RIE or a wet etch that removes the dielectric material(s) that provides the gate dielectric layer selective to the semiconductor material that provides the semiconductor fins 20 and the dielectric materials that provides the first insulating spacer 40 and the fin caps 22.

Figure 10:
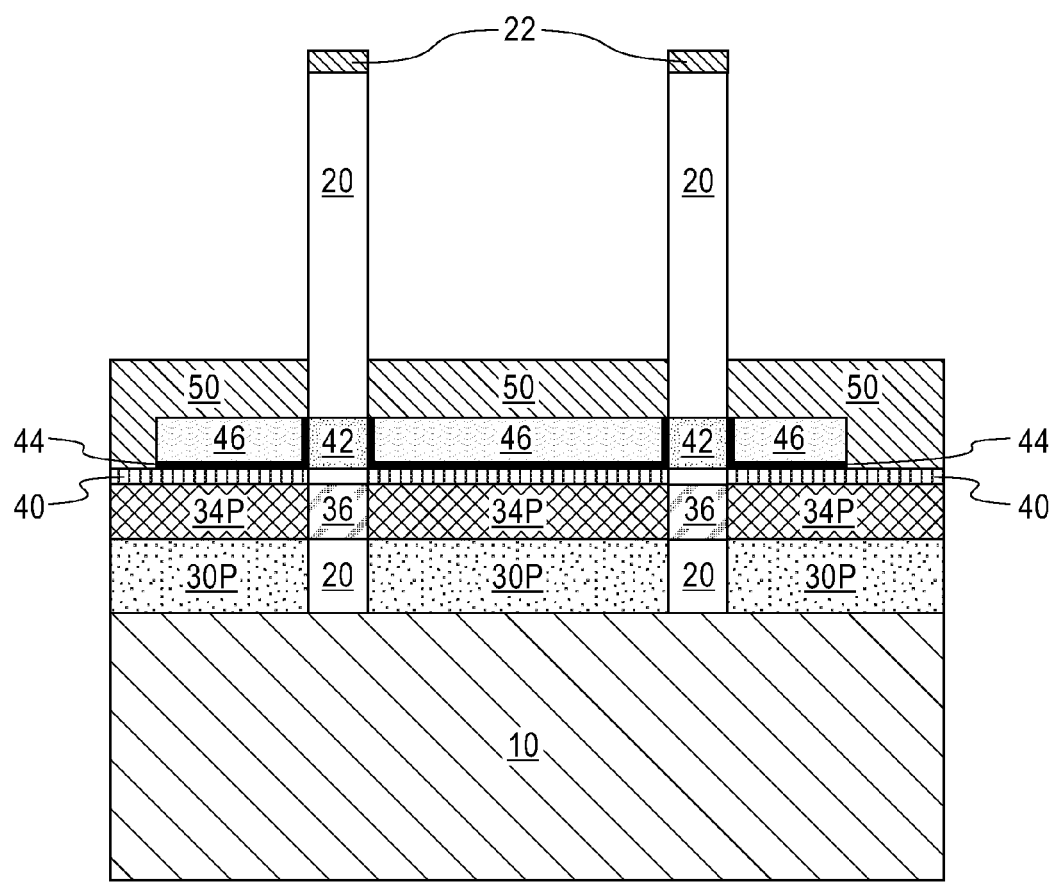
FIG. 10 is a cross-sectional view of the exemplary semiconductor structure of FIG. 9 after forming a second insulating spacer layer over the first gate structure and the first insulating spacer.

Referring now to FIG. 10, there is illustrated the exemplary semiconductor structure of FIG. 9 after forming a second insulating spacer layer 50 over the first gate structure (44, 46) and the first insulating spacer 40. The second insulating spacer layer 50 may be composed of a dielectric material that is the same as, or different from, the dielectric material that provides the first insulating spacer 40. In one embodiment, the second insulating spacer layer 50 includes a dielectric oxide such as, for example, silicon dioxide. The second insulating spacer layer 50 may be formed by depositing a dielectric material over the first gate structure (44, 46) and the first insulating spacer 40 using, for example, CVD or PVD, planarizing the deposited dielectric material by, for example, CMP, and then etching back the deposited dielectric material to the desired thickness. In some embodiments, the planarizing step may be omitted. A topmost surface of the second insulating spacer layer 50 thus is located below the topmost surface of each semiconductor fin 20. An anisotropic etch such as, for example, RIE may be employed to remove the dielectric material of the second insulating spacer layer 50 selective to the semiconductor material that provides the semiconductor fins 20 and the dielectric material that provides the fin caps 22.

Figure 11:
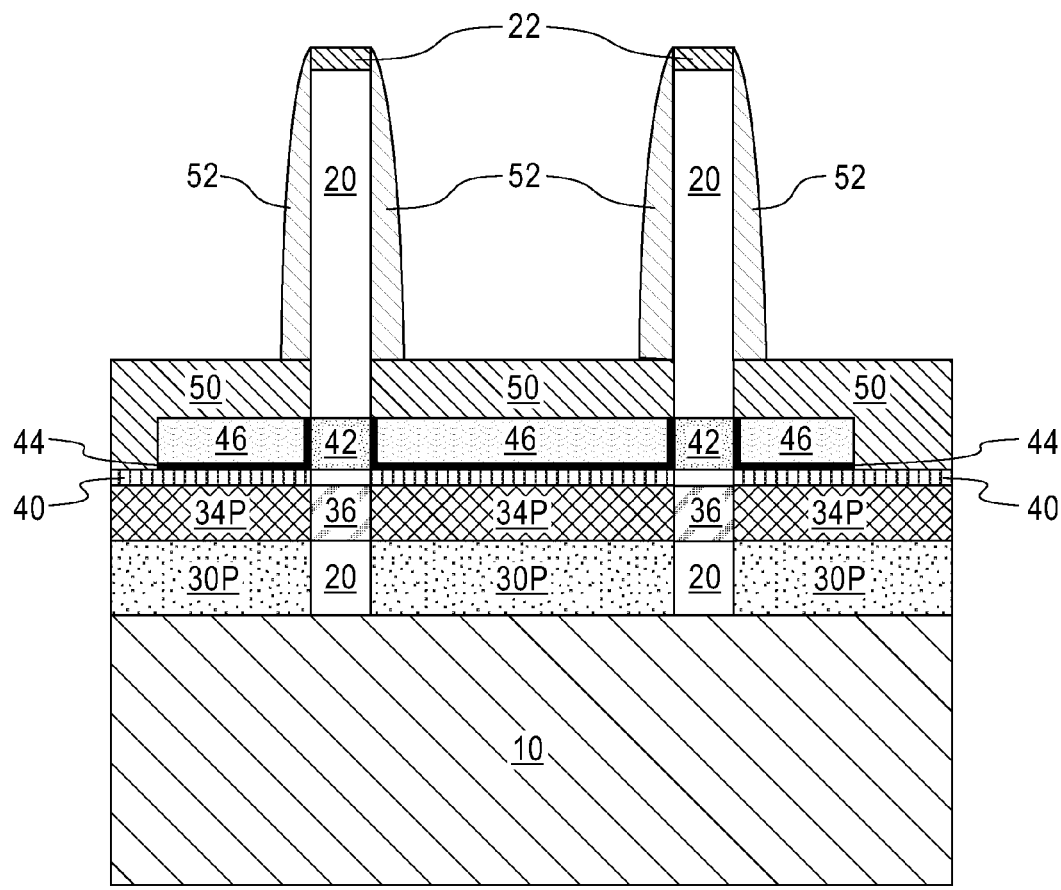
FIG. 11 is a cross-sectional view of the exemplary semiconductor structure of FIG. 10 after forming a second sacrificial spacer on sidewalls of a portion of each semiconductor fin located above the second insulating spacer layer.

Referring now to FIG. 11, there is illustrated the exemplary semiconductor structure of FIG. 10 after forming a second sacrificial spacer 52 on physically exposed sidewalls of a portion of each semiconductor fin 20 located above the second insulating spacer layer 50 and sidewalls of each fin cap 22. Each second sacrificial spacer 52 may include a dielectric material that is the same as, or different from, the dielectric material that provides each first sacrificial spacer 32. For example, each second sacrificial spacer 52 may include a dielectric nitride such as, for example, silicon nitride. The second sacrificial spacers 52 can be formed by performing processing steps described above with respect to the formation of the first sacrificial spacers 32.

Figure 12:
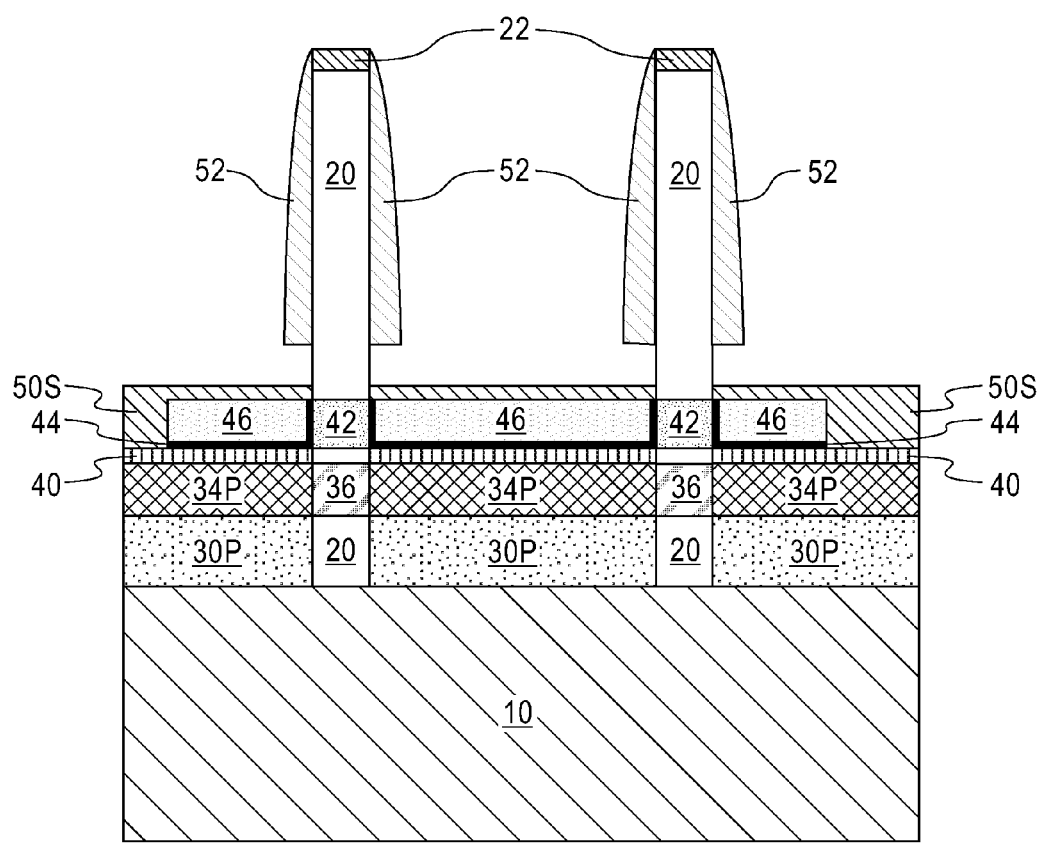
FIG. 12 is a cross-sectional view of the exemplary semiconductor structure of FIG. 11 after recessing the second insulating spacer layer to form a second insulating spacer.

Referring now to FIG. 12, there is illustrated the exemplary semiconductor structure of FIG. 11 after recessing the second insulating spacer layer 50 to form a second insulating spacer 50S covering the first gate structure (44, 46). The second insulating spacer 50S has a topmost surface located below a bottommost surface of each second sacrificial spacer 52.

The second insulating spacer layer 50 may be recessed using an isotropic etch. The isotropic etch can be a dry etch or a wet etch that removes the dielectric material that provides the second insulating spacer layer 50 selective to the semiconductor material that provides the semiconductor fins 20 and the dielectric materials that provide the second sacrificial spacers 52 and the fin caps 22. In one embodiment, a RIE may be performed. After recessing, sidewalls of a portion of each semiconductor fin 20 that is located between the second insulating spacer 50S and a corresponding second sacrificial spacer 52 are exposed.

Figure 13:
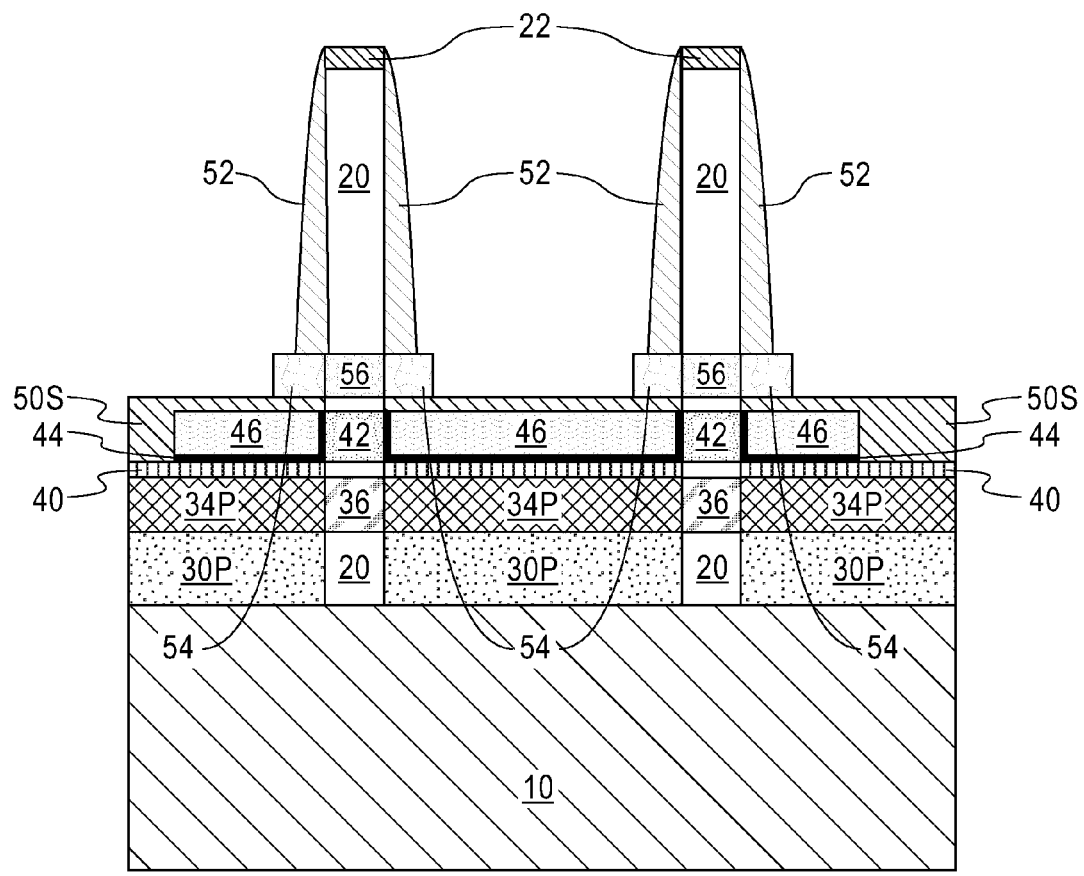
FIG. 13 is a cross-sectional view of the exemplary semiconductor structure of FIG. 12 after epitaxially growing a second doped epitaxial semiconductor region from sidewalls of a physically exposed portion of each semiconductor fin located between the second insulating spacer and each second sacrificial spacer and forming a second doped fin region within each semiconductor fin.

Referring now to FIG. 13, there is illustrated the exemplary semiconductor structure of FIG. 12 after growing a second doped epitaxial semiconductor region 54 from the sidewalls of the physically exposed portion of each semiconductor fin 20 located between the second insulating spacer 50S and each second sacrificial spacer 52. In one embodiment, and as is shown, each second doped epitaxial semiconductor region 54 covers portions of a second insulating spacer 50S adjoined to each semiconductor fin 20.

Each second doped epitaxial semiconductor region 54 may include a semiconductor material that is the same as, or different from, the semiconductor material that provides the first doped epitaxial semiconductor region 34P. Each second doped epitaxial semiconductor region 54 also contains a dopant having a same conductivity type as that of the dopant in the first doped epitaxial semiconductor region 34P. In one embodiment, both first doped epitaxial semiconductor region 34P and the second doped epitaxial semiconductor region 54 are doped with a p-type dopant for formation of p-type FETs. In another embodiment, both first doped epitaxial semiconductor region 34P and the second doped epitaxial semiconductor region 54 are doped with an n-type dopant for formation of n-type FETs. The dopant concentration of each second doped epitaxial semiconductor region 54 can be selected to be no greater than that of the first doped epitaxial semiconductor region 34P. In one embodiment, the dopant concentration of each second doped epitaxial semiconductor region 54 can be from $1\times10^{20}$ atoms/cm$^3$ to $1\times10^{21}$ atoms/cm$^3$, although lesser and greater dopant concentration can also be employed.

Each second doped epitaxial semiconductor region 54 can be formed utilizing a selective epitaxial growth process described above with respect to the formation of the first doped epitaxial semiconductor layer 34. During the selective epitaxial growth, the semiconductor material that provides the second doped epitaxial semiconductor regions 54 only grows from the exposed sidewall surfaces of each semiconductor fin 20, but not from the dielectric surfaces such as exposed surfaces of the second insulating spacer 50S, the second sacrificial spacers 52 and the fin caps 22. The dopant can be provided during the selective epitaxial growth process by in-situ doping, or after the selective epitaxial growth process by ion implantation or gas phase doping.

Subsequently, an anneal is performed to drive the dopant in the second doped epitaxial semiconductor region 54 into a portion of each semiconductor fin 20 adjoined to the second doped epitaxial semiconductor region 54, thus forming a second doped fin region 56 within each semiconductor fin 20. Collectively, a second doped epitaxial semiconductor region 54 and a second doped fin region 56 laterally contacted by the second doped epitaxial semiconductor region 54 constitute another source/drain region for each first vertical FET.

A first vertical FET is thus formed in a lower portion of each semiconductor fin 20. The first vertical FET includes, from bottom to top, a first source/drain region including a first doped fin region 36 located within the semiconductor fin 20 and a first doped epitaxial semiconductor region 34P laterally contacting the first doped fin region 36, a first gate structure (44, 46) laterally contacting a first channel region 42 of the semiconductor fin 20, and a second source/drain region including a second doped fin region 56 located within the semiconductor fin 20 and a second doped epitaxial semiconductor region 54 laterally contacting the second doped fin region 56. The first source/drain region (34P, 36) of the first vertical FET is separated from the first gate structure (44, 46) by a first insulating spacer 40 located between the first doped epitaxial semiconductor region 34P and the first gate structure (44, 46). The second source/drain region (54, 56) of the first vertical FET is separated from the first gate structure (44, 46) by a second insulating spacer 50S located between the second doped epitaxial semiconductor region 54 and the first gate structure (44, 46).

Figure 14:
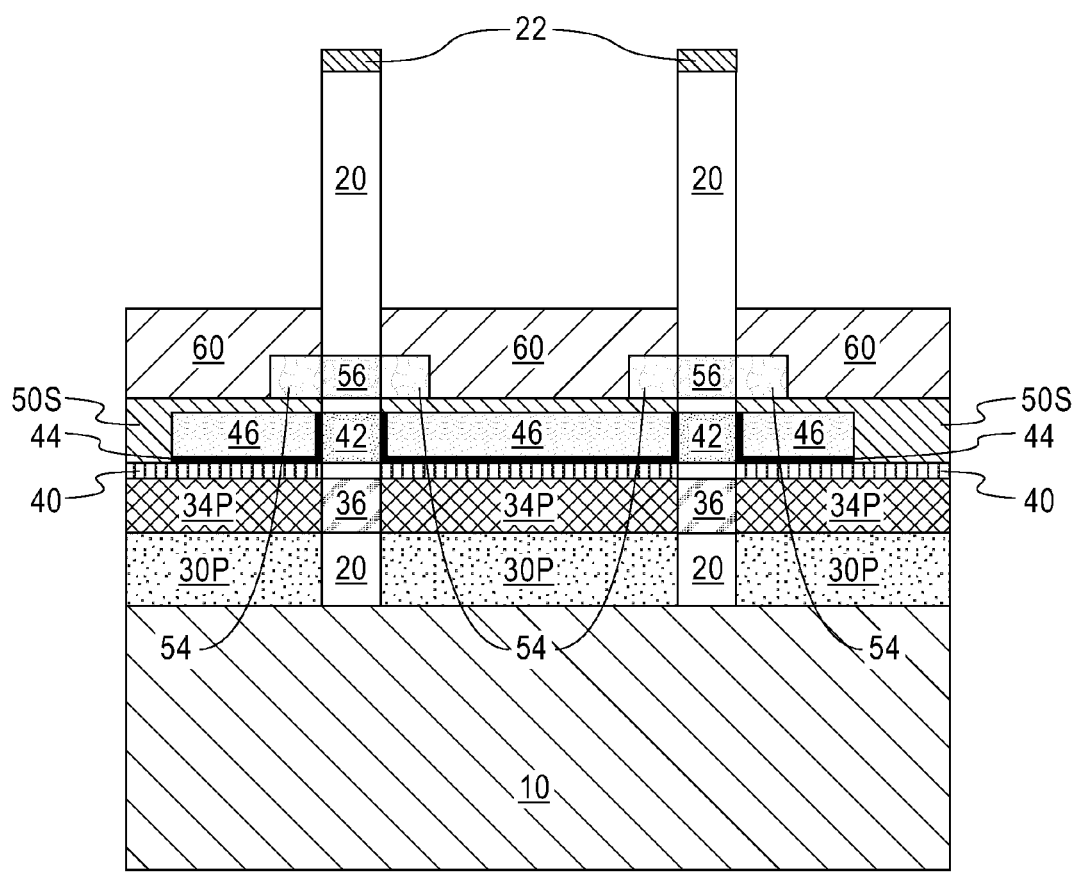
FIG. 14 is a cross-sectional view of the exemplary semiconductor structure of FIG. 13 after removing the second sacrificial spacers and forming a third insulating spacer layer over each second doped epitaxial semiconductor region and the second insulating spacer.

Referring now to FIG. 14, there is illustrated the exemplary semiconductor structure of FIG. 13 after removing the second sacrificial spacers 52 from sidewalls of the semiconductor fins 20 and the fin caps 22 and forming a third insulating spacer layer 60 over each second doped epitaxial semiconductor region 54 and the second insulating spacer 50P. The third insulator layer 60 has a topmost surface located between the topmost surface of each semiconductor fin 20 and the topmost surface of each second doped epitaxial semiconductor region 54.

The second sacrificial spacers 52 can be removed by performing the processing steps described above with respect to the removal of the first sacrificial spacers 32. The third insulating spacer layer 60 may include a dielectric material that is the same as, or different from the dielectric material that provides the second insulating spacer layer 50. For example, the third insulating spacer layer 60 may include a dielectric nitride such as, for example, silicon nitride. The third insulating spacer layer 60 can be formed by performing the processing steps described above with respect to the formation of second insulating spacer layer 50.

Figure 15:
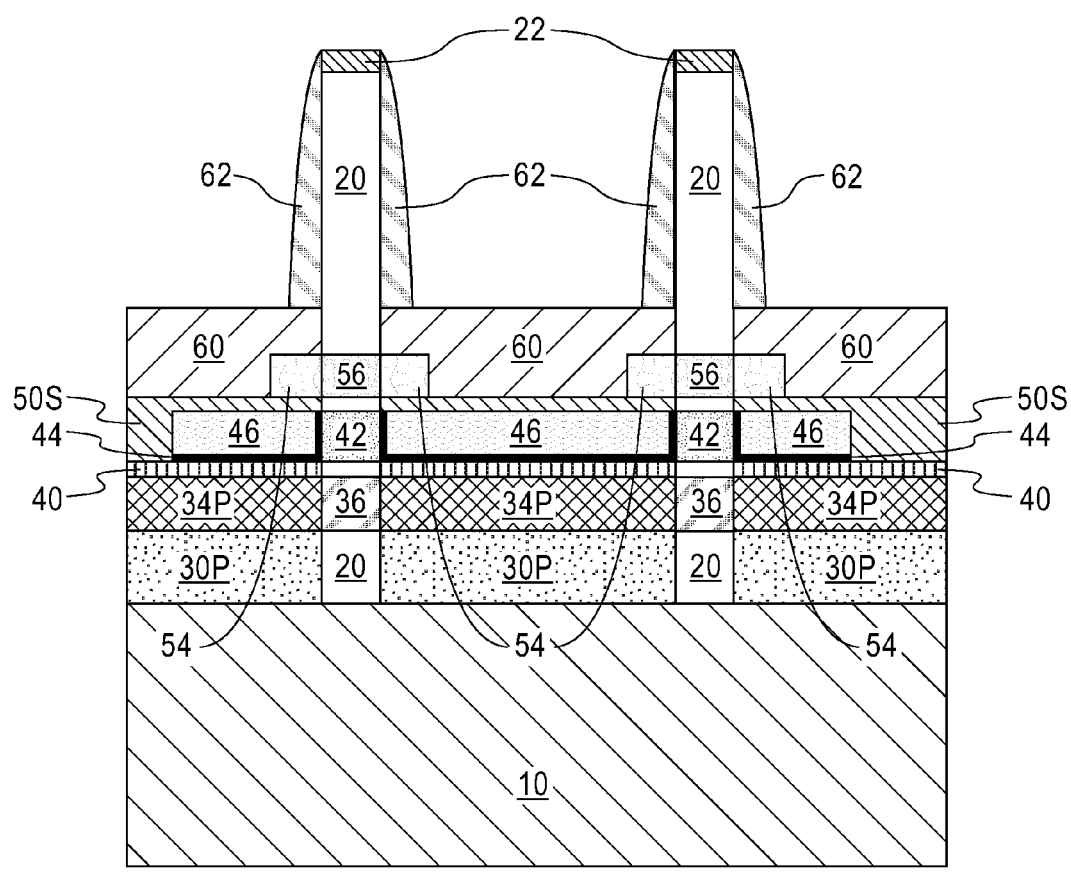
FIG. 15 is a cross-sectional view of the exemplary semiconductor structure of FIG. 14 after forming a third sacrificial spacer on sidewalls of a portion of each semiconductor fin located above the third insulating spacer layer.

Referring now to FIG. 15, there is illustrated the exemplary semiconductor structure of FIG. 14 after forming a third sacrificial spacer 62 on sidewalls of a portion of each semiconductor fin 20 located above the third insulating spacer layer 60 and sidewalls of the fin caps 22. Each third sacrificial spacer 62 may include a dielectric material that is the same as, or different from, the dielectric material that provides each first sacrificial spacer 32. Each third sacrificial spacer 62 can be formed by performing processing steps described above with respect to the formation of each first sacrificial spacer 32.

Figure 16:
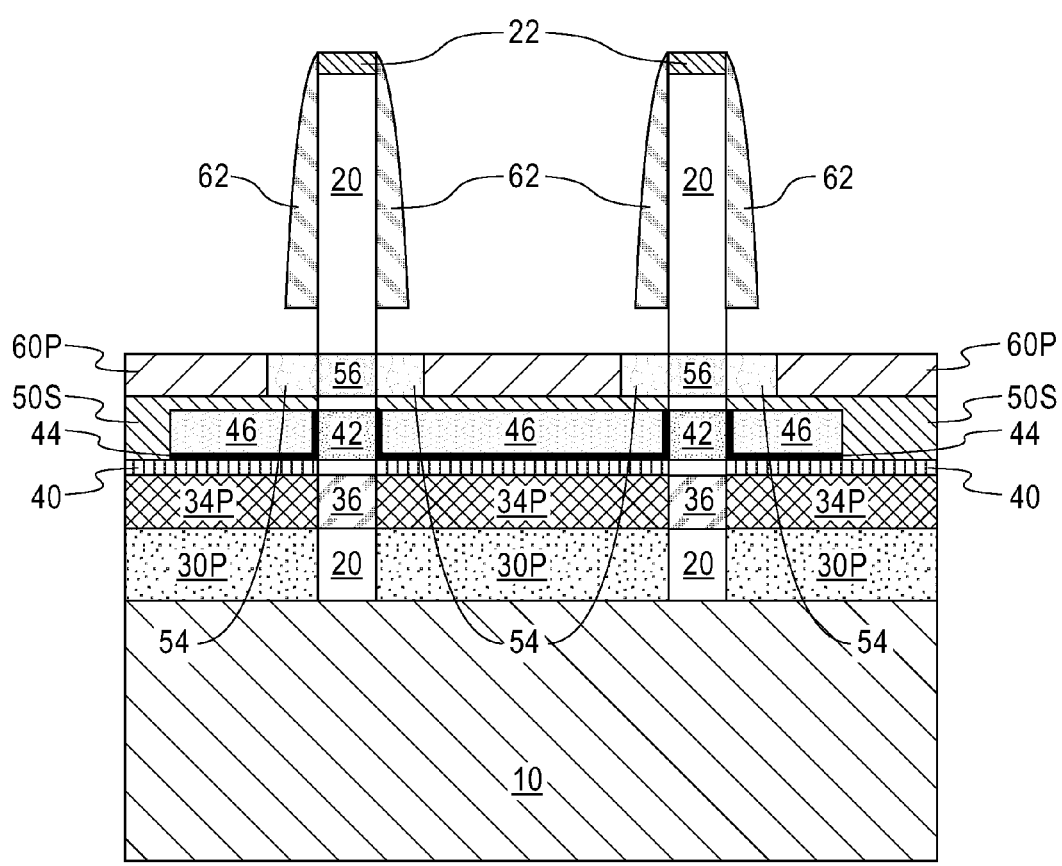
FIG. 16 is a cross-sectional view of the exemplary semiconductor structure of FIG. 15 after recessing the third insulating spacer layer to form a third insulating spacer layer portion laterally surrounding the second doped epitaxially semiconductor region.

Referring now to FIG. 16, there is illustrated the exemplary semiconductor structure of FIG. 15 after recessing the third insulating spacer layer 60 to form a third insulating spacer layer portion 60P. The third insulating spacer layer 60 can be recessed by performing processing steps described above with respect to the recess of the second insulating spacer layer 50. The third insulating spacer layer 60 is recessed until a topmost surface of each second doped epitaxial semiconductor region 54 is exposed. A remaining portion of the third insulating spacer layer 60 constitutes the third insulating spacer layer portion 60P. In one embodiment, and as is shown, the topmost surface of the third insulating spacer layer portion 60P is coplanar with the topmost surface of each second doped epitaxial semiconductor region 54. After recessing, sidewalls of a portion of each semiconductor fin 20 that is located between each third sacrificial spacer 62 and a respective second doped epitaxial semiconductor region 54 are exposed.

Figure 17:
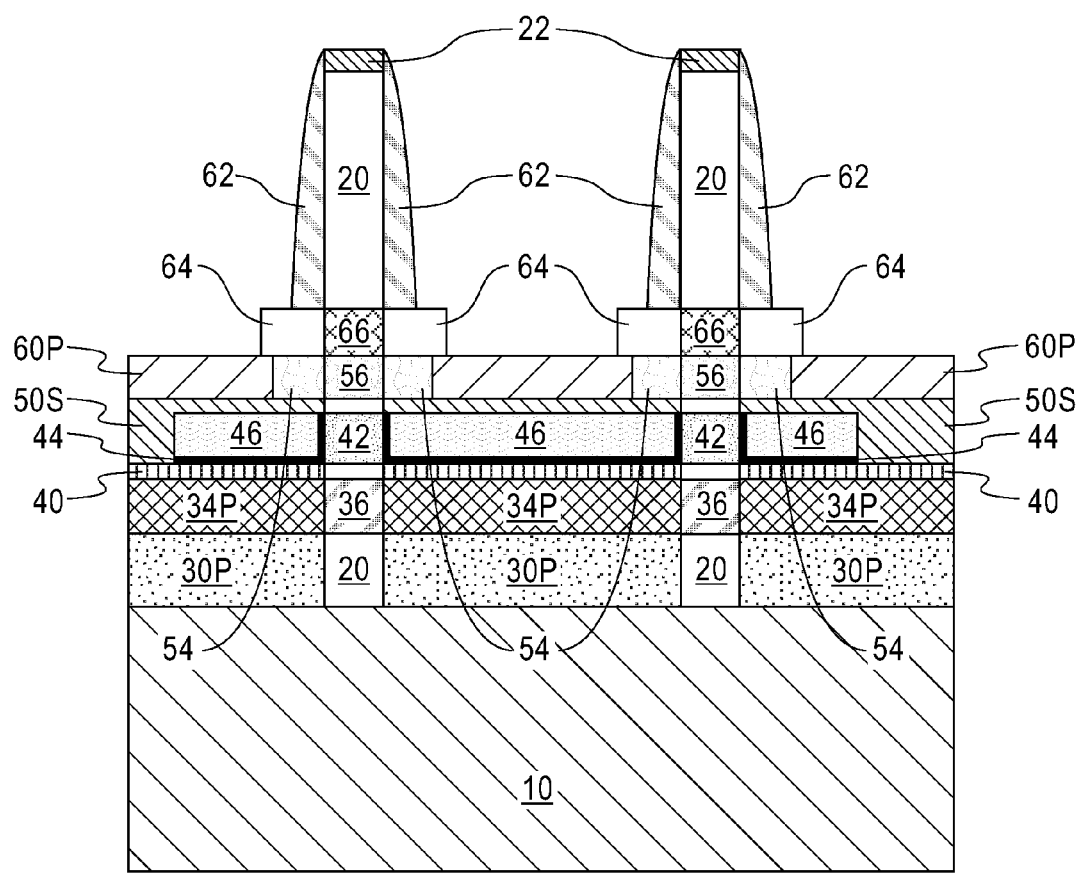
FIG. 17 is a cross-sectional view of the exemplary semiconductor structure of FIG. 16 after forming a third doped epitaxial semiconductor region between each third sacrificial spacer and a respective second doped epitaxial semiconductor region and a third doped fin region within each semiconductor fin.

Referring now to FIG. 17, there is illustrated the exemplary semiconductor structure of FIG. 16 after forming a third doped epitaxial semiconductor region 64 on a respective second doped epitaxial semiconductor region 54.

Each third doped epitaxial semiconductor region 64 may include a semiconductor material that is the same as, or different from, the semiconductor material that provides each second doped epitaxial semiconductor region 54. Each third doped epitaxial semiconductor region 64 also contains a dopant having a second conductivity type. The second conductivity type can be the same as, or different from the first conductivity type. For example, in instances where the first conductivity is p-type, the second conductivity type can be n-type or p-type. The dopant concentration of each third doped epitaxial semiconductor region 64 can be the same as, or different from the dopant concentration of each second doped epitaxial semiconductor region 54. In one embodiment, the dopant concentration of each third doped epitaxial semiconductor region 64 can be from $1 \times 10^{20}$ atoms/cm$^3$ to $1 \times 10^{21}$ atoms/cm$^3$, although lesser and greater dopant concentration can also be employed.

Each third doped epitaxial semiconductor region 64 can be formed utilizing a selective epitaxial growth process described above with respect to the formation of the first doped epitaxial semiconductor layer 34. During the selective epitaxial growth, the semiconductor material that provides each third doped epitaxial semiconductor region 64 only grows from semiconductor surfaces including exposed sidewall surfaces of each semiconductor fin 20 and a topmost surface of each second doped epitaxial semiconductor region 54, but not from the dielectric surfaces such as exposed surfaces of the third insulating spacer layer portion 60P, the third sacrificial spacers 62 and the fin caps 22. The selective epitaxial growth process may continue until each third doped epitaxial semiconductor region 64 extends above the third insulating spacer layer portion 60P as shown in FIG. 17. The dopant can be provided during the selective epitaxial growth process by in-situ doping, or after the selective epitaxial growth process by ion implantation or gas phase doping.

Subsequently, an anneal is performed to drive the dopant in the third doped epitaxial semiconductor region 64 into the portion of each semiconductor fin 20 adjoined to the third doped epitaxial semiconductor region 64, thus forming a third doped fin region 66 within each semiconductor fin 20. Collectively, a third doped epitaxial semiconductor region 64 and a third doped fin region 66 laterally contacted by the third doped epitaxial semiconductor region 64 constitute a source/drain region for each second vertical FET. Each second vertical FET can be an n-type or a p-type FET.

Figure 18:
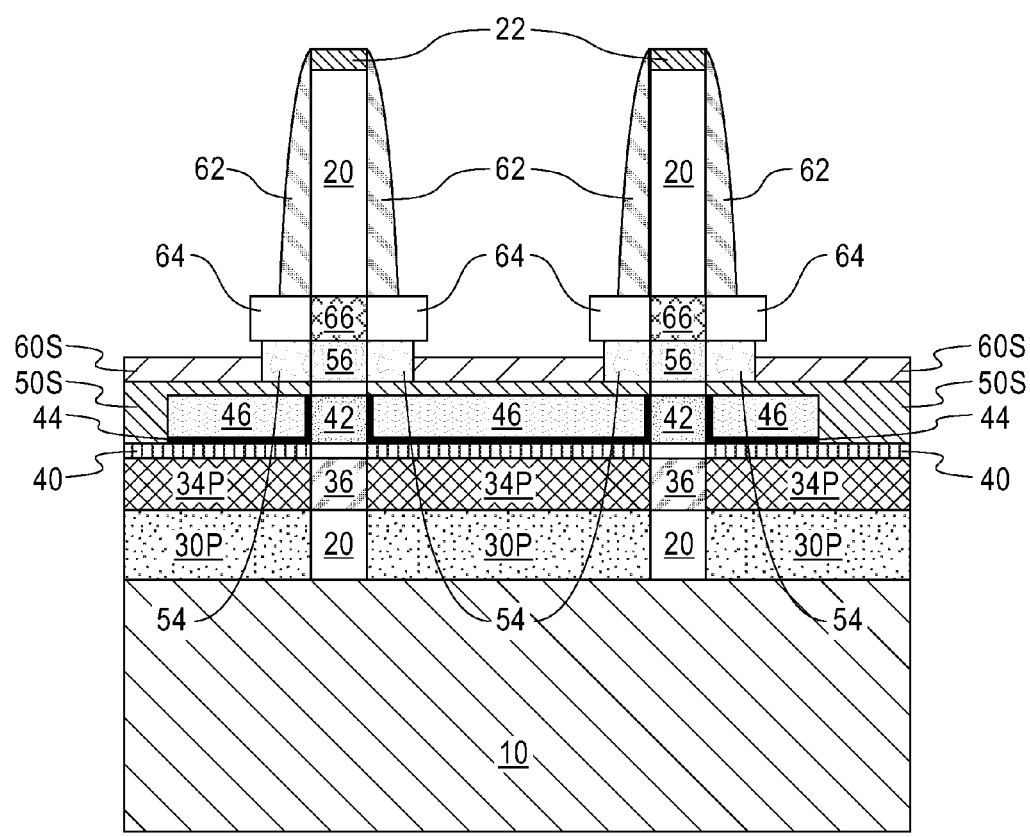
FIG. 18 is a cross-sectional view of the exemplary semiconductor structure of FIG. 17 after recessing the third insulating spacer layer portion to form a third insulating spacer laterally surrounding a lower portion of each third doped epitaxial semiconductor region and to expose an upper portion of each third doped epitaxial semiconductor region.

Referring now to FIG. 18, there is illustrated the exemplary semiconductor structure of FIG. 17 after recessing the third insulating spacer layer portion 60P to expose an upper portion of each third doped epitaxial semiconductor region 64. The third insulating spacer layer portion 60P can be removed by an isotropic etch. The isotropic etch can be a dry etch such as, for example, RIE or a wet etch that removes the dielectric material that provides the third insulating spacer layer portion 60P selective to the semiconductor materials that provide the semiconductor fins 20 and the second and third doped epitaxial semiconductor regions 54, 64 and the dielectric materials that provides the fin caps 22 and the third sacrificial spacers 62. After recessing, a remaining portion of the third insulator layer portion 60P constitutes a third insulating spacer 60S.

Figure 19:
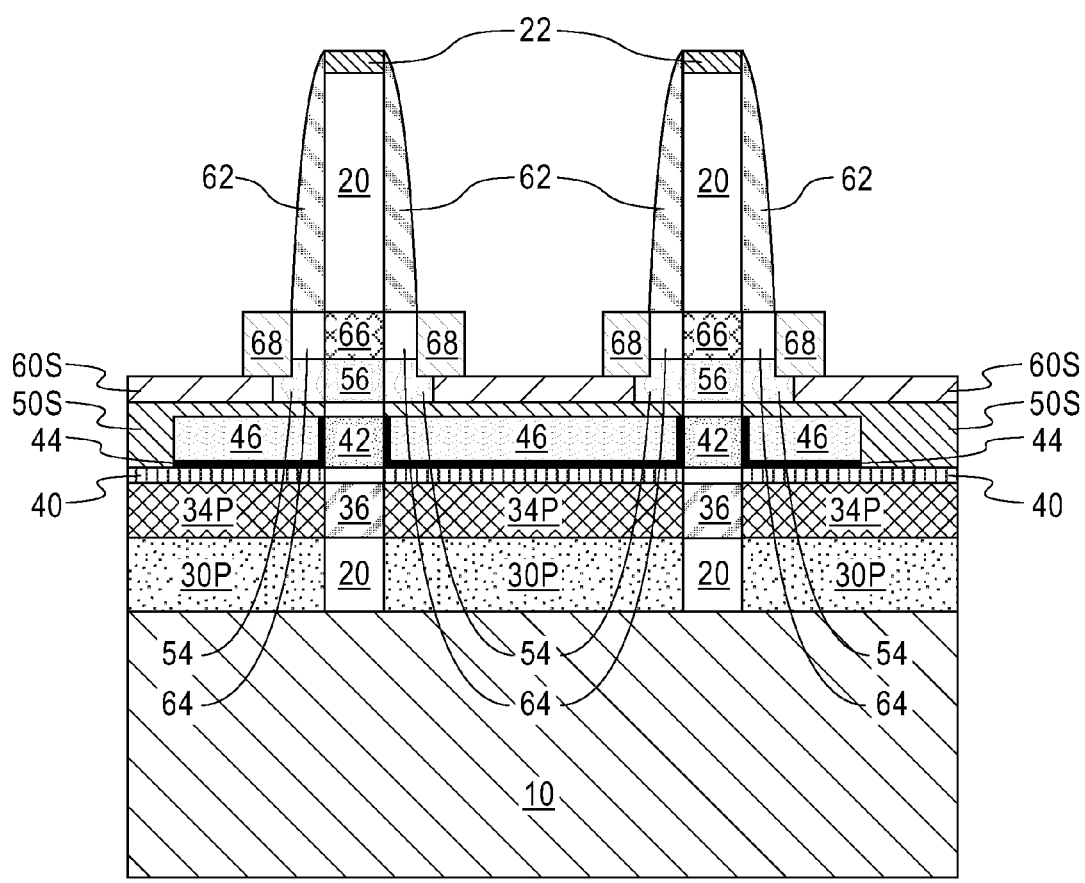
FIG. 19 is a cross-sectional view of the exemplary semiconductor structure of FIG. 18 after forming a conductive strap structure around each pair of second doped epitaxial semiconductor region and third doped epitaxial semiconductor region.

Referring now to FIG. 19, there is illustrated the exemplary semiconductor structure of FIG. 18 after forming a conductive strap structure 68 around each pair of second doped epitaxial semiconductor region 54 and third doped epitaxial semiconductor region 64. Each second doped epitaxial semiconductor region 54 is thus electrically tied to a corresponding third doped epitaxial semiconductor region 64 by a conductive strap structure 68.

Each conductive strap structure 68 may be composed of a metal semiconductor alloy. The metal semiconductor alloy can be a silicide or germicide. In one embodiment, the conductive strap structures 68 can be formed by first depositing a metal layer (not shown) along physically exposed surfaces of the second and third doped epitaxial semiconductor regions 54, 64, the third insulating spacer 60S, the third sacrificial spacers 62 and the fin caps 22. The metal layer may include a metal such as, for example, Ni, Co, Pt, W, Ti, Ta, a rare earth metal (e.g., Er, Yt, La), an alloy thereof, or any combination thereof. The metal layer may be deposited by CVD, PVD or ALD. The thickness of the metal layer can be from 2 nm to 10 nm, although lesser and grater thicknesses can also be employed.

An anneal is subsequently performed at an elevated temperature to induce reaction of the semiconductor material(s) of the second and third epitaxial semiconductor regions 54, 64 and the metal in the metal layer to provide each conductive strap structure 68. The unreacted portion of the metal layer is then removed, for example, by an etch, which can be a wet etch that removes the metal in the metal layer selective to the metal semiconductor alloy in each conductive strap structure 68.

Figure 20:
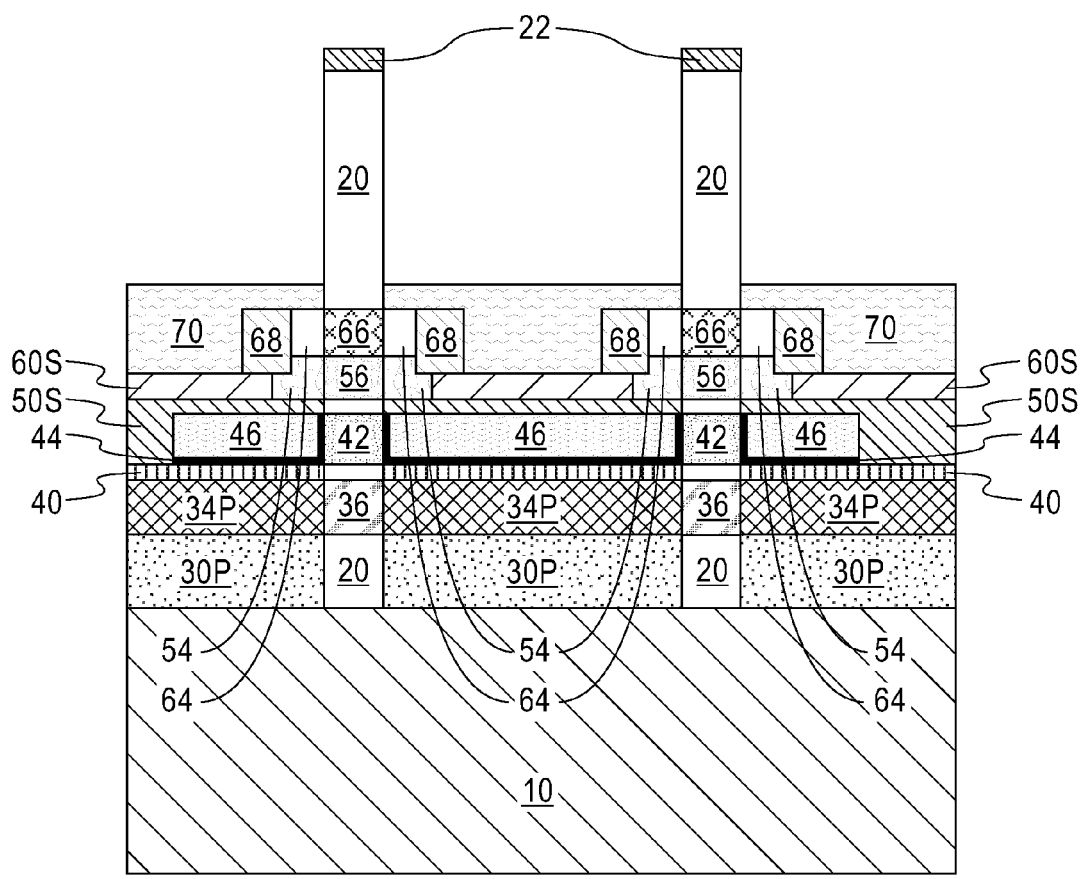
FIG. 20 is a cross-sectional view of the exemplary semiconductor structure of FIG. 19 after removing each third sacrificial spacer and forming a fourth insulating spacer over each third doped epitaxial semiconductor region, each conductive strap structure, and the third insulating spacer.

Referring now to FIG. 20, there is illustrated the exemplary semiconductor structure of FIG. 19 after removing the third sacrificial spacers 62 from sidewalls of the semiconductor fins 20 and the fin caps 22 and forming a fourth insulating spacer 70 over each third doped epitaxial semiconductor region 64, each conductive strap structure 68, and the third insulating spacer 60S. The fourth insulating spacer 70 may include a dielectric material that is the same as, or different from the dielectric material that provides the third insulator spacer 60S. For example, the fourth insulating spacer 70 may include a dielectric nitride such as, for example, silicon nitride.

The third sacrificial spacers 62 can be removed by performing the processing steps described above with respect to the removal of the first sacrificial spacers 32. The fourth insulating spacer 70 can be formed by performing the processing steps described above with respect to the formation of second insulating spacer layer 50.

Figure 21:
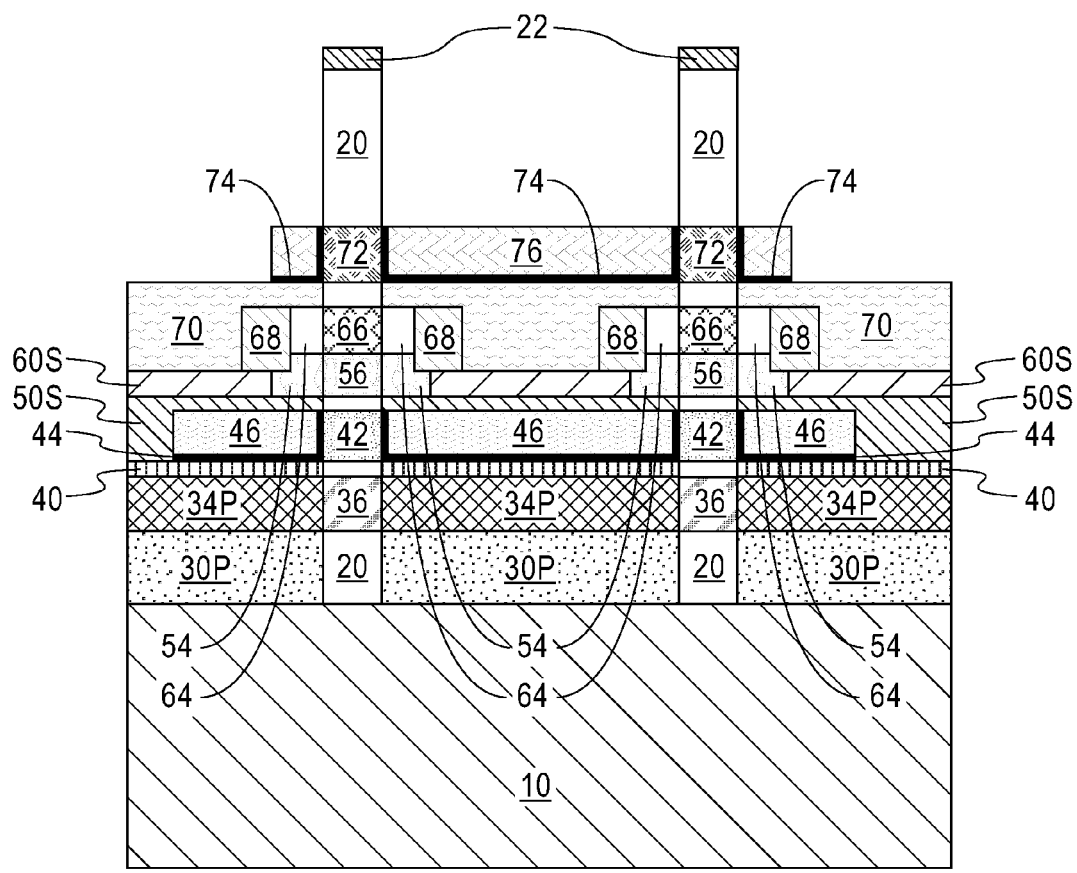
FIG. 21 is a cross-sectional view of the exemplary semiconductor structure of FIG. 20 after forming a second gate structure laterally contacting sidewalls of a second channel region of each semiconductor fin.

Referring now to FIG. 21, there is illustrated the exemplary semiconductor structure of FIG. 20 after forming a second gate structure laterally contacting sidewalls of a second channel region 72 of each semiconductor fin 20. The second gate structure includes a second gate dielectric 74 present on sidewalls of the second channel region 72 of each semiconductor fin 20 and a topmost surface of the fourth insulating spacer 70, and a second gate electrode 76 present on the second gate dielectric 74. The second gate dielectric 74 may include a gate dielectric material that is the same as, or different from, the gate dielectric material that provides the first gate dielectric 44. The second gate electrode 76 may include a work function metal and/or a gate fill metal described above for the first gate electrode 46. The type of work function metal employed is determined by the type of each second vertical FET subsequently formed. For example, if each second vertical FET is an n-type FET, an n-type work function metal can be employed in the second gate electrode 76. The second gate structure (74, 76) can be formed by performing processing steps described above with respect to the formation of the first gate structure (44, 46).

Figure 22:
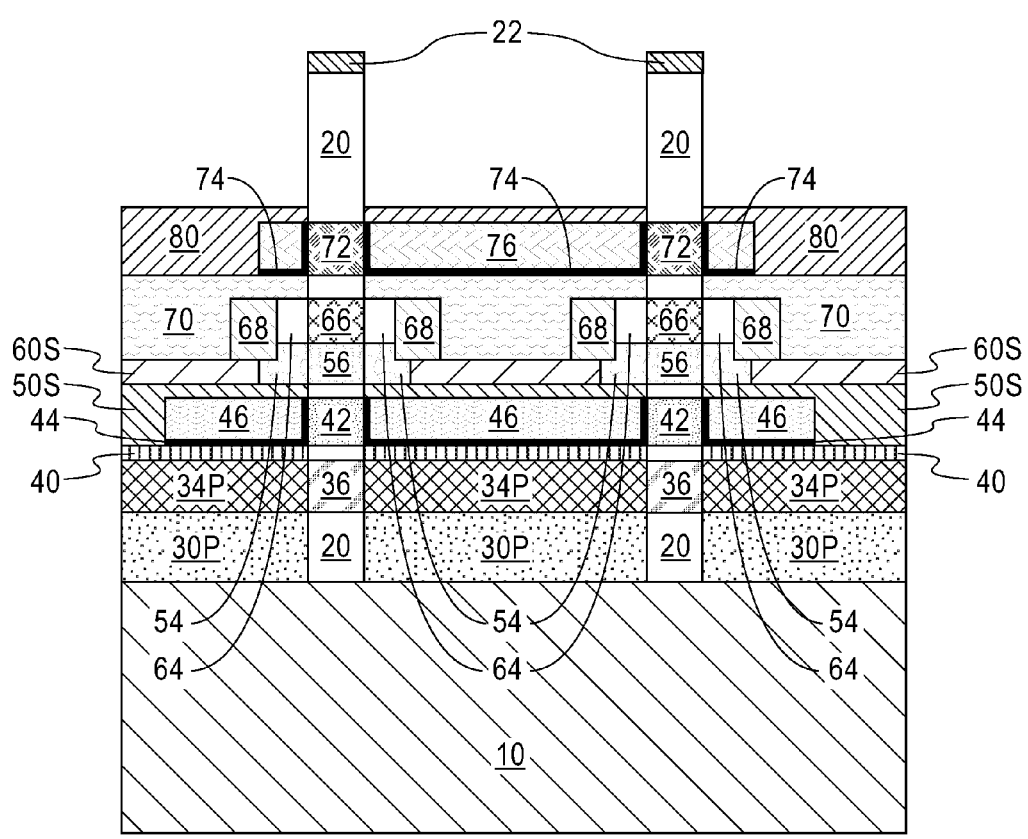
FIG. 22 is a cross-sectional view of the exemplary semiconductor structure of FIG. 21 after forming a fifth insulating spacer over the second gate structure and the fourth insulating spacer.

Referring now to FIG. 22, there is illustrated the exemplary semiconductor structure of FIG. 21 after forming a fifth insulating spacer 80 on top of the second gate structure (74, 76) and the fourth insulating spacer 70. The fifth insulating spacer 80 can be formed by performing the processing steps described above with respect to the formation of second insulating spacer layer 50.

Figure 23:
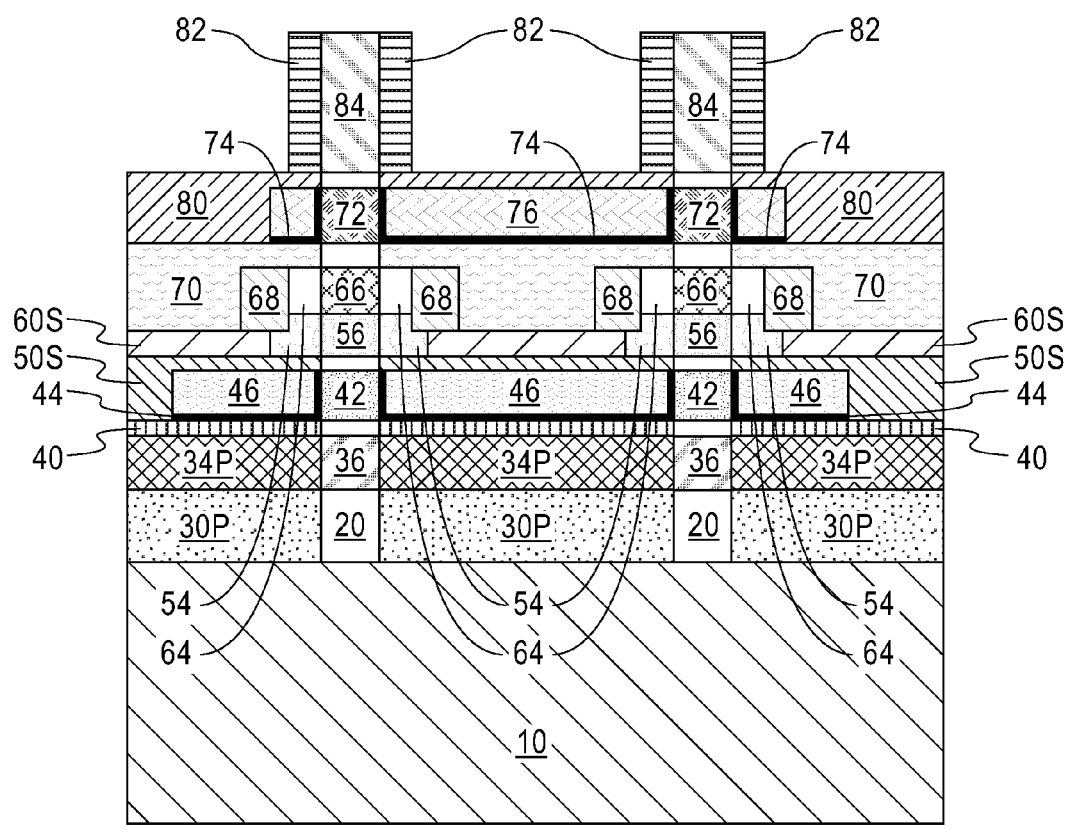
FIG. 23 is a cross-sectional view of the exemplary semiconductor structure of FIG. 22 after forming a fourth doped epitaxial semiconductor region surrounding a top portion of each semiconductor fin located above the fifth insulating spacer and forming a fourth doped fin region within each semiconductor fin.

Referring now to FIG. 23, there is illustrated the exemplary semiconductor structure of FIG. 22 after forming a fourth doped epitaxial semiconductor region 82 on sidewalls of a top portion of each semiconductor fin 20 that is located above the fifth insulating spacer 80. Each fourth doped epitaxial semiconductor region 82 may include a semiconductor material that is the same as, or different from, the semiconductor material that provides each third doped epitaxial semiconductor layer region 64. Each fourth doped epitaxial semiconductor region 82 also contains a dopant of the second conductivity type.

Each fourth doped epitaxial semiconductor region 82 can be formed utilizing a selective epitaxial growth process described above with respect to the formation of the first doped epitaxial semiconductor layer 34. During the selective epitaxial growth, the semiconductor material that provides each fourth doped epitaxial semiconductor region 82 only grows from the semiconductor surfaces including physically exposed sidewall surfaces of the top portion of each semiconductor fin 20, but not from the dielectric surface such as the topmost surface of the fifth insulating spacer 80 and sidewall and top surfaces of the fin caps 22. The dopant can be provided during the selective epitaxial growth process by in-situ doping, or after the selective epitaxial growth process by ion implantation or gas phase doping. After formation of the fourth doped epitaxial semiconductor region 82, the fin caps 22 can be removed by planarization such as, for example, CMP or by an etch back process.

Subsequently, an anneal is performed to drive dopant in each fourth doped epitaxial semiconductor region 82 into the top portion of each semiconductor fin 20, forming a fourth doped fin region 84 within the top portion of each semiconductor fin 20. Collectively, a fourth doped fin region 84 and a surrounding fourth doped epitaxial semiconductor region 82 constitute another source/drain region for each second vertical FET.

A second vertical FET is thus formed stacked on a respective first vertical FET. The second vertical FET can have a conductivity type that is the same as, or different from, the conductivity type of the first vertical FET. For example and when the first vertical FET is a p-type FET, the second vertical FET can be an n-type FET or a p-type FET. The stack of the first vertical FET and the second vertical FET can thus be n-type FET/p-type FET, n-type FET/n-type FET, p-type FET/p-type FET or p-type FET/n-type FET. The second vertical FET includes, from bottom to top, a third source/drain region including a third doped fin region 66 located within the semiconductor fin 20 and a third doped epitaxial semiconductor region 64 laterally contacting the third doped fin region 66, a second gate structure (74, 76) laterally contacting a second channel region 72 of the semiconductor fin 20, and a fourth source/drain region including a fourth doped fin region 84 located within the semiconductor fin 20 and a fourth doped epitaxial semiconductor region 84 laterally contacting the fourth doped fin region 84. The third source/drain region (64, 66) of the second vertical FET is separated from the second gate structure (44, 46) by a fourth insulating spacer 70 located between the fourth doped epitaxial semiconductor region 64 and the second gate structure (74, 76). The fourth source/drain region (82, 84) of the second vertical FET is separated from the second gate structure (74, 76) by a fifth insulating spacer 80 located between the fourth doped epitaxial semiconductor region 82 and the second gate structure (74, 76).

The third source/drain region (64, 66) of the second vertical FET is electrically connected to the second source/drain region (54, 56) of the first vertical FET by a conductive strap structure 68.

In the present application, although a stacked vertical FET structure containing two vertical FETs is shown, it should be noted more than two vertical FETs can be stacked on a single semiconductor fin 20. The processing steps described above with respect to the formation of the second vertical FETs can be repeated to form a multi-stacked vertical FET structure.

Figure 24:
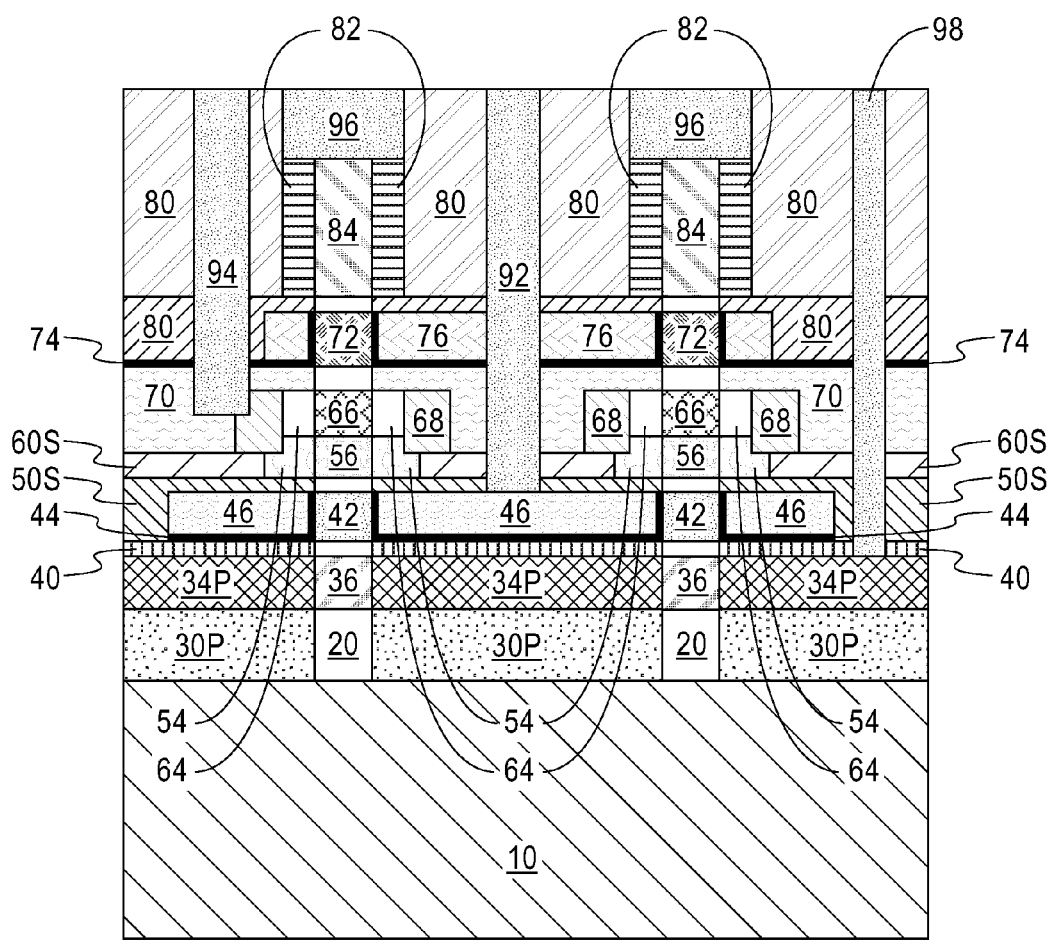
FIG. 24 is a cross-sectional view of the exemplary semiconductor structure of FIG. 23 after forming a contact level dielectric layer and various contact structures.

Referring now to FIG. 24, there is illustrated the exemplary semiconductor structure of FIG. 23 after forming a contact level dielectric layer 90 over the fifth insulating spacer 80 and the source region (82, 84) of each second vertical FET and forming various contact structures.

The contact level dielectric layer 90 may include a dielectric material such as, for example, oxides, nitrides or oxynitrides. In one embodiment, the contact level dielectric layer 90 includes SiCN. The contact level dielectric layer 90 may be formed, for example, by CVD or spin coating. The contact level dielectric layer 90 may be self-planarizing, or the topmost surface of the contact level dielectric layer 90 can be planarized, for example, by CMP. In one embodiment, the planarized topmost surface of the contact level dielectric layer 90 is located above a topmost surface of each fourth doped epitaxial semiconductor region 82.

Subsequently, various contact structures are formed. The contact structures include a common gate contact structure 92 extending through the contact level dielectric layer 90, the fifth insulating spacer 80, the second gate structure (74, 76), the fourth insulating spacer 70, the third insulating spacer 60S and the second insulating spacer 50S to form contact with both the first gate electrode 46 in the first gate structure (444, 46) and the second gate electrode 76 in the second gate structure (74, 76), an internal node contact structure 94 extending through the contact level dielectric layer 90, the fifth insulating spacer 80 and the fourth insulating spacer 70 to form contact with the conductive strap structure 68, a first source/drain contact structure 96 extending through the contact level dielectric layer 70 to form contact with each fourth doped epitaxial semiconductor region 82, and a second source/drain contact structure 98 extending through the contact level dielectric layer 90, the fifth insulating spacer 80, the fourth insulating spacer 70, the third insulating spacer 60S, the second insulating spacer 50S, and the first insulating spacer 40 to form contact with the first doped epitaxial semiconductor region 34P.

The various contact structures (92, 94, 96, 98) can be formed by formation of contact openings (not shown) through the dielectric material components including the contact level dielectric layer 90, the fifth insulating spacer 80, the fourth insulating spacer 70, the third insulating spacer 60S, the second insulating spacer 50S and the first insulator spacer 40, and for the common gate contact structure, also through the second gate structure (74, 76), utilizing a combination of lithographic patterning and anisotropic etch followed by deposition of a conductive material (e.g., copper) and planarization that removes an excess portions of the conductive material from above the topmost surface of the contact level dielectric layer 90. Optionally, contact liners (not shown) may be formed on the sidewalls and bottoms surfaces of the contact openings before filling the contact openings with the conductive material. The contact liners may include TiN.

In some embodiments of the present application, the second source/drain contact structure 98 can also be formed as a back contact (not shown). In this case, the second source/drain contact structure 98 extends through the semiconductor portion 10 and the STI structure 30P to form contact with the first doped epitaxial semiconductor region 34P. In some embodiments, separate gate contacts (not show) can be formed such that a first gate contact forms contact with the first gate structure (44, 46) while a second gate contact forms contact with the second gate structure (74, 76).

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A semiconductor structure comprising:
   a first vertical field effect transistor (FET) of a first conductivity type, wherein the first vertical FET comprises:
      a first doped epitaxial semiconductor region along sidewalls of a first doped fin region of a semiconductor fin that extends upwards from a semiconductor substrate portion,
      a first gate structure along sidewalls of a first channel region of the semiconductor fin that is located above the first doped fin region, and
      a second doped epitaxial semiconductor region along sidewalls of a second doped fin region of the semiconductor fin that is located above the first channel region;
   a second vertical FET of a second conductivity type stacked on the first vertical FET, wherein the second vertical FET comprises:
      a third doped epitaxial semiconductor region along sidewalls of a third doped fin region of the semiconductor fin that is located atop the second doped fin region,
      a second gate structure along sidewalls of a second channel region of the semiconductor fin that is located above the third doped fin region, and
      a fourth doped epitaxial semiconductor region along sidewalls a fourth doped fin region of the semiconductor that is located above the second channel region; and
   a conductive strap structure laterally contacting the second doped epitaxial semiconductor region and the third doped epitaxial semiconductor region.

2. The semiconductor structure of claim 1, wherein the conductive strap structure laterally contacts an entirety of the third doped epitaxial semiconductor region and an upper portion of the second doped epitaxial semiconductor region.

3. The semiconductor structure of claim 1, further comprising a first insulating spacer separating the first doped epitaxial semiconductor region from the first gate structure.

4. The semiconductor structure of claim 3, further comprising a second insulating spacer separating the first gate structure from the second doped epitaxial semiconductor region.

5. The semiconductor structure of claim 4, further comprising a third insulating spacer located over the second insulating spacer and laterally contacting a portion of the second doped epitaxial semiconductor region that is not laterally contacted by the conductive strap structure.

6. The semiconductor structure of claim 5, wherein the conductive strap structure vertically contacts the third insulating spacer.

7. The semiconductor structure of claim 6, further comprising a fourth insulating spacer separating the third doped epitaxial semiconductor region and the conductive strap structure from the second gate structure.

8. The semiconductor structure of claim 6, further comprising a fifth insulating spacer separating the second gate structure from the fourth doped epitaxial semiconductor region.

9. The semiconductor structure of claim 1, wherein the conductive strap structure comprises a silicide or germicide.

10. The semiconductor structure of claim 1, wherein the second conductivity type is opposite to, or the same as, the first conductivity type.

11. The semiconductor structure of claim 1, wherein the fourth doped epitaxial semiconductor region contacts the sidewalls and a topmost surface of the fourth doped fin region.

* * * * *